United States Patent [19]

Fiala et al.

[11] Patent Number: 5,058,144

[45] Date of Patent: Oct. 15, 1991

[54] SEARCH TREE DATA STRUCTURE ENCODING FOR TEXTUAL SUBSTITUTION DATA COMPRESSION SYSTEMS

[75] Inventors: Edward R. Fiala; Daniel H. Greene, both of Sunnyvale, Calif.

[73] Assignee: Xerox Corporation, Stamford, Conn.

[21] Appl. No.: 395,163

[22] Filed: Aug. 16, 1989

Related U.S. Application Data

[63] Continuation of Ser. No. 187,699, Apr. 29, 1988, abandoned.

[51] Int. Cl.⁵ .............................................. H04B 1/66
[52] U.S. Cl. ...................................... 375/122; 341/79
[58] Field of Search ............... 341/59, 79, 51; 382/56; 370/118; 364/200, 900; 375/122; 358/135, 138; 340/347 DD

[56] References Cited

U.S. PATENT DOCUMENTS

| | | | |
|---|---|---|---|
| 3,394,352 | 7/1968 | Wernikoff et al. | 364/900 |
| 4,464,650 | 8/1984 | Eastman et al. | 341/51 |
| 4,626,829 | 12/1986 | Hauck | 340/347 DD |
| 4,730,348 | 3/1988 | MacCrisken | 375/122 |

OTHER PUBLICATIONS

Robert G. Gallager, "Information Theory and Reliable Communication", 1968, pp. 38-58.

Primary Examiner—Benedict V. Safourek
Assistant Examiner—Tesfaldet Bocure

[57] ABSTRACT

Non-redundant encoding for textual substitution data compression systems is provided by encoding the structure of search tree constructed and maintained by the compressor for the compression of the source data, thereby enabling an encoder to reconstruct an identical search tree for expanding the data.

3 Claims, 15 Drawing Sheets

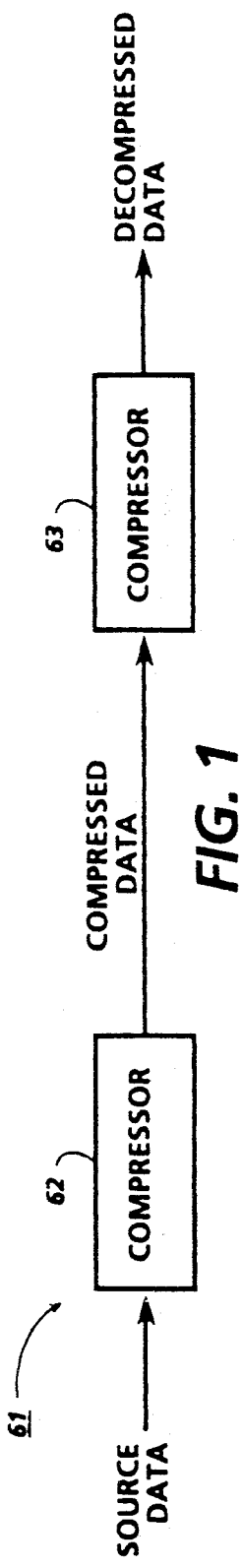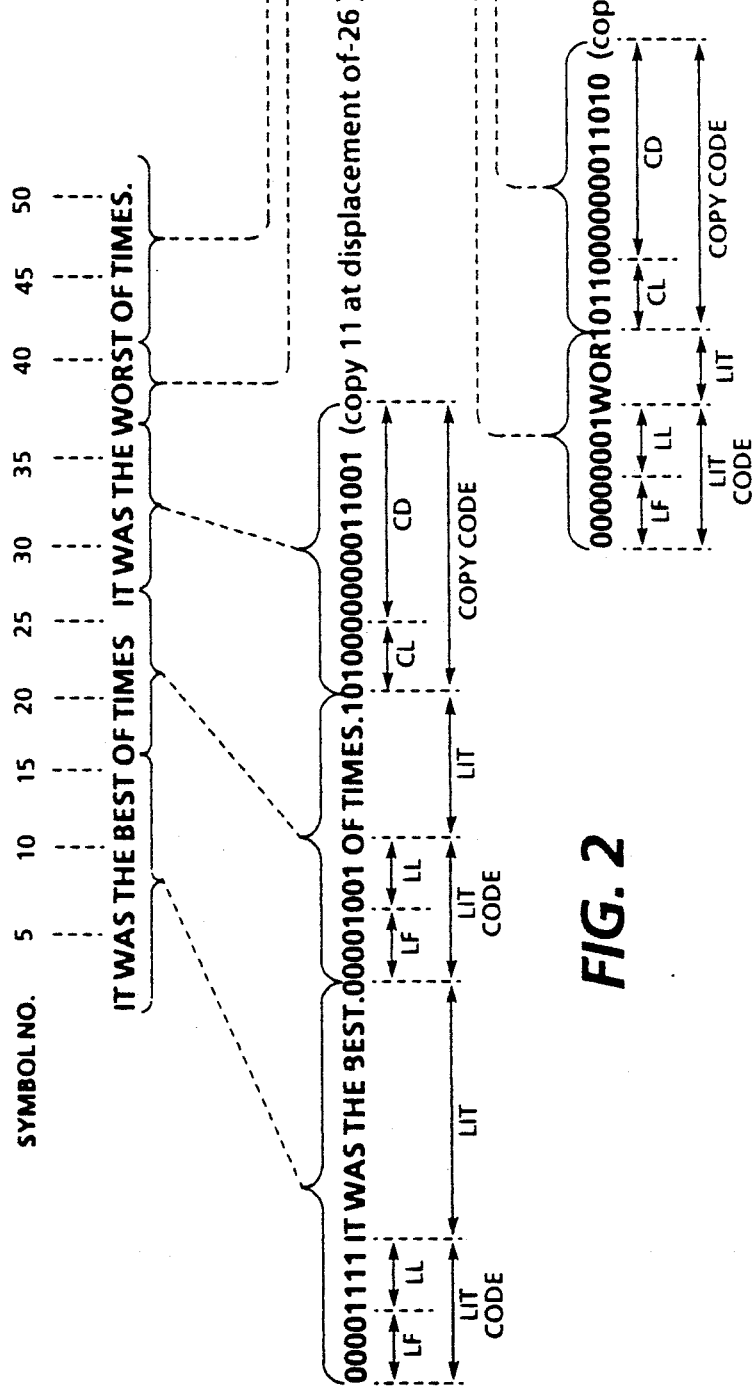

ASTRAY ASTRIDE ASTRINGENT

Step 1

Step 5

To other strings starting with T and R

Step 6

To other strings starting with T, R and Y

Step 1

Step 5

Step 6

Step 11

SEARCH TREE DATA STRUCTURE ENCODING FOR TEXTUAL SUBSTITUTION DATA COMPRESSION SYSTEMS

This is a continuation of application Ser. No. 07/187,699, filed Apr. 29, 1988, now abandoned.

FIELD OF THE INVENTION

This invention relates to digital data compression systems and, more particularly, to adaptive and invertible or lossless digital data compression systems.

CROSS-REFERENCE TO RELATED APPLICATIONS

This is one of three commonly assigned and concurrently filed U.S. patent applications of the named inventors. The others relate to "Textual Substitution Data Compression with Finite Length Search Windows" U.S. patent application Ser. No. 07/187,793, filed Apr. 29, 1988, now U.S. Pat. No. 4,906,991, and to "Start, Step, Stop Unary Coding for Data Compression" U.S. patent application Ser. No. 07/581,178, filed Sept. 6, 1990. A common detailed description has been used because the inventions covered by the different applications may be combined in various ways.

BACKGROUND OF THE INVENTION

Digital data compression is an important tool because it can be utilized, for example, to reduce the storage requirements for files, to increase the rate at which data can be transferred over bandwidth limited communication channels, and to reduce the internal redundancy of data prior to its encryption in order to provide increased security.

There are special purpose and general purpose data compression systems. Special purpose systems often are satisfactory when used to compress source data for which they have been optimized. However, general purpose systems customarily are designed to adapt to the source data, so they usually are better suited for compressing unknown or diverse source data types. Ideally, these general purpose systems are not only able to adapt promptly to fundamental changes in the compositional structure of the source data as may be required to provide significant compression for small files and for sources with internally inconsistent statistical characteristics, but also are able to provide near optimal compression for large files with stable statistical characteristics. Designers have taken various approaches to resolving these competing design goals, but the results of their efforts have not been fully satisfactory.

Shannon communication theory (C. E. Shannon, "A Mathematical Theory of Communication," *The Bell System Technical Journal*, Vol. XXVII, No. 3, 1948, pp. 379-423 and No. 4, 1948, pp. 623-656) indicates that the ideal encoding of a given source symbol uses space equal to $-\log_2$ of the probability, P, of the occurrence of the symbol. When the encoding conforms to this memoryless model, the average space needed to represent any symbol is the entropy of the source:

$$H_0 = - \sum_{i=0}^{n-1} P(x = c_i) \log_2 P(x = c_i) \quad (1)$$

where:

x is a randomly chosen symbol from a source containing n unique symbols; and $c_i$ ranges over all possible source symbols.

D. A. Huffman, in "A Method for the Construction of Minimum Redundancy Codes," *Proceedings of the I.R.E.*, Vol. 40, 1952, pp. 1098-1110, suggested mapping variable length codes onto the source symbols in accordance with the statistical frequency distribution of the symbols to provide a discrete approximation of such ideal encoding. Thereafter, arithmetic coding techniques were developed to further optimize the encoding by arithmetically modifying the last few bits of the previously encoded symbols, thereby avoiding the waste of fractional bits. See, for example, R. C. Pasco, "Source Coding Algorithms for Fast Data Compression," Ph. D. Dissertation, Stanford University, 1976; G. G. Langdon, Jr. et al., "Compression of Black-White Images with Arithmetic Coding," *IEEE Transactions on Communications*, Com-29, No. 6, 1981, pp. 858-867; G. G. Langdon, Jr. et al., "A Double Adaptive File Compression Algorithm," *IEEE Transactions on Communications*, Com-31, No. 11, 1983, pp. 1253-1255; and J. Rissanen et al., "Universal Modeling and Coding," *IEEE Transactions on Information Theory*, IT-27, No. 1, 1981, pp. 12-23.

As a practical matter, however, the zero-order entropy model of equation (1) fails to capture a significant part of the redundancy of many conventional sources. For example, English language text normally exhibits a substantial drop in first-order entropy:

$$H_1 = - \sum_{i,j=0}^{n-1} P(x = c_i) P(y = c_j | x = c_i) \log_2 P(y = c_j | x = c_i) \quad (2)$$

where: xy is a randomly chosen pair of adjacent source characters.

Thus, several of the above-identified references have extended Huffman and arithmetic coding techniques by basing the coding on statistics that are conditioned by the frequency at which any given symbol is preceded by at least one and usually two or more other symbols. Unfortunately, however, the increased compression that is achieved in that way characteristically requires substantially more memory and processing time to carry out the compression process.

Others have proposed so-called "textual substitution" data compression processes for capturing the high-order coherence of text and similar source data, without having to pre-condition the capture mechanism on statistical probabilities. J. Ziv and A. Lempel proposed an algorithmic model for a textual substitution process based on the notion that a reoccurrence of a string of previously encoded symbols can be represented by prefacing the symbol immediately following such a reoccurrence (i.e., the suffix character of the reoccurring string) with a copy codeword which (1) points to one end (e.g., the lead end) of the prior occurrence of the string and (2) identifies the length of the reoccurring string. They recognized that such a copy codeword would fully and completely define the reoccurring symbol string, so they envisioned "substituting" the codeword for the symbols of the reoccurring symbol string to provide a compressed representation of them. See J. Ziv et al., "A Universal Algorithm for Sequential Data Compression," *IEEE Transactions on Information Theory*, IT-23, No. 3, 1977, pp. 337-343.

Regrettably, compression systems based on the original Ziv-Lempel algorithm tend to be unacceptably slow and have not achieved particularly high compression. To improve speed, they and other workers in the field have developed various alternatives. Some of these alternatives adopted artificially rigid parsing mechanisms to simplify the generation of the copy codewords and to limit the size of the data structures that are needed to carry out the compression. See, for example, J. Ziv et al., supra; J. Ziv, "Coding Theorems for Individual Sequences," *IEEE Transactions on Information Theory*, IT-24, No. 4, 1978, pp. 405–412; J. Ziv et al., "Compression of Individual Sequences Via Variable-Rate Coding," *IEEE Transactions on Information Theory*, IT-24, No. 5, 1978, pp. 530–536; and W. L. Eastman et al., U.S. Pat. No. 4,464,650, which issued Aug. 7, 1984, on "Apparatus and Method for Compressing Data Signals and Restoring the Compressed Data." However, these modified Ziv-Lempel style data compression systems have not been fully satisfactory because their performance typically is disappointing as measured by the speed at which they adapt and/or the compression they provide.

A somewhat different approach that has been proposed for utilizing textual substitution for data compression is based upon building adaptive lists or dictionaries of individual symbols and symbol strings. See, for example, V. S. Miller et al., "Variations on a Theme by Ziv and Lempel," IBM Research Report, RC 10630, #47798, 1984, *Combinational Algorithms on Words*, NATO, ASI Series F, Vol. 12, 1985, pp. 131–140; T. A. Welch, "A Technique for High Performance Data Compression," *IEEE Computer*, Vol. 17, No. 6, 1984, pp. 8–19; and J. L. Bonkley, "A Locally Adaptive Data Compression Scheme," *Communications of the ACM*, Vol. 29, No. 4, 1984, pp. 320–330. But, these systems are slow to adapt and achieve inferior compression.

Still further background on the textual substitution digital data compression art is provided, for example, by M. Rodeh et al., "Linear Algorithm for Data Compression Via String Matching," *Journal of the Association for Computing Machinery*, Vol. 28, No. 1, 1981, pp. 16–24; J. A. Storer, "Data Compression Via Textual Substitution," *Journal of the Association for Computing Machinery*, Vol. 29, No. 4, 1982, pp. 928–951; G. Guoan et al., "Using String Matching to Compress Chinese Characters," *Stanford Technical Report*, STAN-CS-82-914, 1982; and G. G. Langdon, Jr., "A Note on the Ziv-Lempel Model for Compressing Individual Sequences," *IEEE Transactions on Information Theory*, IT-29, No. 2, 1983, pp. 284–287.

In view of the disadvantages of the prior art, it will be apparent that there still is a need for practical general purpose, adaptive and invertible (i.e., lossless) data compression systems for reliably and efficiently compressing large sources having stable statistical characteristics, as well as less extensive sources and sources having variable statistical characteristics. Textual substitution techniques would be well suited to that task, but improved methods and means for carrying out such a data compression process in practice are needed to more fully realize its potential.

SUMMARY OF THE INVENTION

In accordance with the present invention, the structure of a search tree constructed and maintained by the compressor of a textual substitution data compression system is encoded to represent the source symbol strings inserted into the search tree, thereby enabling an expander to reconstruct and maintain a search tree which replicates the compressor search tree at corresponding stages in the compression process. The search tree provides a single search path for any given symbol string, so there is no redundancy in the encoding of the compressed data.

BRIEF DESCRIPTION OF THE DRAWINGS

These and other features and advantages of the present invention will become apparent when the following detailed description is read in conjunction with the attached drawings, in which:

FIG. 1 is a simplified block diagram of a data compression system;

FIG. 2 is a diagram illustrating the encoding of a string of sample text in accordance with a basic embodiment of the present invention;

DETAILED DESCRIPTION OF THE PREFERRED EMBODIMENTS

Figure 3:
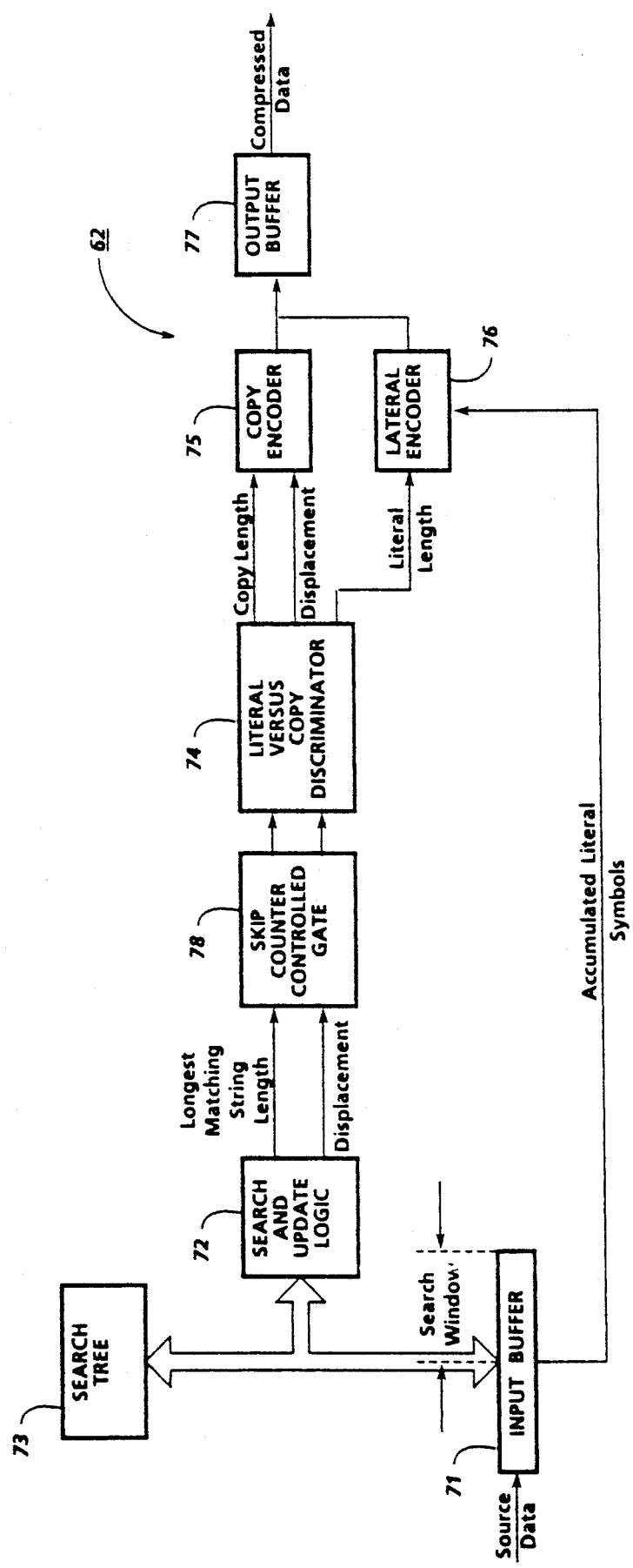
FIG. 3 is a more detailed block diagram of a data compressor constructed to perform the encoding illustrated in FIG. 2.

While the invention is described in some detail hereinbelow with reference to certain illustrated embodiments, it is to be understood that there is no intent to limit it to those embodiments. On the contrary, the aim is to cover all modifications, alternatives and equivalents falling within the spirit and scope of the invention as defined by the appended claims.

A. Overview

Turning now to the drawings, and at this point especially to FIG. 1, there is a data compression system 61 having a compressor 62 for compressing serial, digitally encoded source data and an expander 63 for serially decompressing the data. Various embodiments of the present invention are described and others will suggest themselves, but each of them provides an invertible or lossless data compression system, thereby ensuring that the expanded or decompressed data is essentially identical to the original source data. Furthermore, all embodiments of this invention are adaptive, so the source data may be composed, for example, of alphanumeric text, scanned or synthetic images, human or machine readable computer code, or different combinations of those and/or other source types.

It is to be understood at the outset that the compressor 62 and expander 63 may be implemented by means of suitably configured hardware or through the use of appropriately programmed general purpose digital computers. Moreover, the compressor 62 and the expander 63 may be located at the same site if it is desired to localize them, such as for loading compressed source data into and retrieving decompressed source data from a file server (not shown). Indeed, a single site software implementation of the compressor 62 and expander 63 can utilize the same computer for executing the compressor and expander programs on command. Alternatively, the compressor 62 and the expander 63 may be located at different sites if it is desired to distribute their functions, such as for transmitting and receiving data via a limited bandwidth communications medium (also not shown). File and stream compressors and expanders will be discussed, so it is to be understood that the primary distinctions between them relate to the flow control of their input data and to the padding of the compressed data with pad codewords to restore their byte alignment. Data is "pushed" into stream compressors and "pulled" from stream expanders by the "client" (a compressor "client" being a data source, and an expander "client" being a data sink), while data is "pulled" into file compressors and expanders under their internal control. Some passing references will be made to the padding of the compressed data with pad codewords, but that subject is generally beyond the scope of the present invention and is within the working knowledge of persons skilled in the art.

To carry out the present invention, the compressor 62 assembles and maintains a complete and current record of all recently compressed source symbols linked in accordance with the order of their occurrence. This record is retained in a suitable memory to provide a first in/first out ("FIFO") "search window" which spans all of the previously compressed symbols in the source data stream between the position, i, of the most recently compressed symbol and a position, i−w, of an earlier compressed symbol, where w is the symbol length of the search window.

In operation, the source symbols are tested prior to being inserted into the search window to determine whether the search window contains matches for any of the extended symbol strings that are formed by supplementing a test symbol at symbol position i+1 with one or more of the symbols that follow it, and, if so, to determine the symbol length of the longest of those matches. If no match is found, or if the longest existing match is too short to satisfy a predetermined "minimum meaningful copy length" criterion, the compressor 62 inserts the test symbol into the compressed data stream behind a fixed or variable length literal codeword having the general form "literal $x_l$." The expander 63, in turn, interprets this codeword as instructing it to pass the next "$x_l$" symbols directly to its output. If, on the other hand, the search window contains a sufficiently long match for such an extended test symbol string, the compressor 62 looks still further ahead symbol-by-symbol in the uncompressed data stream, until either (1) it comes upon a symbol that terminates the longest existing match (i.e., a symbol that fails to further extend the length of that match), or (2) it determines that a maximum permissible match length has been found. In response to either of those events, the compressor 62 inserts a fixed or variable length copy codeword of the general form "copy $x_c$, −y" into the compressed data stream in lieu of the matched symbol string. This codeword instructs the expander 63 to jump back over "y" previously decompressed source symbols, where $y \leq w$, and to then copy "$x_c$" consecutive symbols of progressively more recent vintage into its output, starting the copying process with the symbol at the jump entry position.

B. An Elementary Embodiment

As will be appreciated, the compression achieved depends on the space required for the copy and literal codewords. FIG. 2 illustrates a single pass compression of a familiar passage of text using fixed length, eight and sixteen bit literal and copy codewords, respectively. While the lengths of these codewords are not a fundamental feature of the present invention, it is to be understood that these particular codewords are sufficient for a practical implementation of this invention and have the advantage of byte aligning with source data composed of ordinary eight bit per character text and/or computer source code.

Focusing for a moment on the layouts of the codewords, it will be seen that the first four bit positions of an eight bit literal codeword typically are allocated to a literal flag or identification field, LF, to accommodate a reserved introductory bit sequence, such as "0000," for uniquely identifying the literal codeword. In that case, the other or last four bits of such a codeword reside in a literal length field, LL, for encoding a literal length, $x_l$, in the range [1 ... 16], whereby up to sixteen literal symbols may be appended to such a codeword (i.e., the "maximum permissible literal length"). A copy codeword, on the other hand, contains both a copy length and a displacement or location value. Here, for example, the first four bit positions of each copy codeword are allocated to a copy length field, CL, for encoding a copy length, $x_c$, in the range [2 ... 16], while its remaining or final twelve bit positions provide a copy displacement field, CD, for encoding a displacement, y, in the range [1 ... 4096]. Therefore, up to sixteen symbols may be represented by a single copy codeword, thereby defining the "maximum permissible copy length" (this is one of a number of instances in which codes suitably are shifted down by one, so a code having a binary value of 1 means a copy length of 2, a code having a binary value of 2 means a copy length of 3, etc.). Furthermore, the effective length of the search window is determined because the origin of a matching symbol string is uniquely identifiable only if it is one of 4096 most recently processed symbols positions.

To simplify the example shown in FIG. 2, it has been assumed that the search window of the compressor 62 is initially empty and is of sufficient length to store all of the alphanumeric characters, punctuation, and intermediate spaces of the sample text (i.e., all of its "source symbols"). A simplified computer program for compressing and expanding source data in accordance with one embodiment of this invention is set forth in Appendix A (with some of the more straightforward procedures only functionally described), which is hereby incorporated by reference.

As will be seen, the Appendix A embodiment of the invention imposes the following logical rules on the operation of the compressor 62: (1) if the compressor 62 is idle and if the longest match that is found within the search window for a given test symbol as extended by one or more of the symbols that follow it (i.e., an extended test symbol string) is less than two symbols long, a "literal" is initiated; (2) once initated, a literal is not interrupted prior to attaining its maximum permissible length, unless a match spanning at least three symbols is found; (3) a "copy" is initiated (i) in the event of such an interrupt or (ii) if the compressor 62 is idle and a match spanning at least two symbols is found; (4) a literal codeword and the literal source symbols appended to it are inserted into the compressed data stream whenever (i) a literal is interrupted or (ii) a literal of maximum permissible length is available; and (5) a copy codeword is inserted into the compressed data stream whenever it is determined that the matched input or test symbol string (i) is terminated by a symbol that does not further extend the length of the longest available match or (ii) spans a maximum permissible copy length. The comments appearing in the Appendix will help correlate the foregoing rules with the code. Moreover, the preface of Appendix A refers to several techniques which may be utilized for increasing the execution speed of the compression program and for reducing the amount of memory needed to execute it.

In view of the simplifying assumption that the search window of the compressor 62 initially is empty, it will be evident that the above summarized compression rules cause the compressor 62 to append the first few symbols of the sample text shown in FIG. 2 to a literal codeword. Indeed, in this instance, the compression rules require literal encoding of symbols 1-26, so there are more literals in this first symbol string than any one literal codeword of maximum permissible literal length can effectively communicate to the expander 63. Such a situation is likely to occur from time-to-time, especially during start-up and while the compressor 62 is transitioning from one type of source data to another, so it is important to understand that the compressor 62 recycles whenever it assembles a literal symbol string of maximum permissible literal length. As a result of this recycling, the compressor 62 subdivides longer literal symbol strings into two or more substrings of permissible length and appends those substrings to separate literal codewords for conveying them to the expander 63. For example, symbols 1-16 of the text set forth in FIG. 2 are appended to a first literal codeword having a length value of sixteen, and then symbols 17-26 are appended to a second literal codeword having a length value of ten. As will be appreciated, one benefit of these longer literals is that they effectively reduce the number of literal codewords that are inserted into the compressed data stream while the compressor is adapting to a new source data type.

While symbol 27 of the FIG. 2 text is in symbol position i+1, a three symbol long match is found because symbols 27-29 match previously occurring symbols 1-3. Consequently, the "literal" which is then in progress is interrupted and a "copy" is initiated. This happens to be the first instance of "copy" in this particular example, even though a brief review of the sample text will reveal some prior two symbol long matches. It, therefore, is to be understood that those prior matches were ignored in keeping with the compression rules of Appendix A because each of them was only two symbols long and occurred while a literal was being generated.

Having initiated a "copy" in response to the match found for symbols 27-29, the compressor 62 further extends the matched symbol string with one after another of the following source symbols, until it finds a source symbol which terminates the match (i.e., a symbol that fails to further extend the length of the longest match), as at symbol 38, or until it finds a match of maximum permissible copy length. When either of those events occurs, the compressor 62 issues a copy codeword into the compressed data stream in lieu of the matched symbol string. The copy codeword indicates the length of that symbol string and provides a pointer for locating the lead symbol of its prior occurrence, thereby enabling the expander 63 to recover the symbols represented by the codeword by means of the previously described "jump back" and "copy forward" process.

Referring to FIG. 3, the Appendix A embodiment of the compressor 62 comprises a first in/first out (FIFO) input buffer 71 for storing (1) symbols from an about to be compressed portion of the source in symbol positions leading up to and including symbol position i+1, preceded by (2) the most recently compressed symbols in the search window symbol positions i through i-w. In a software implementation, the buffer 71 suitably is a circular buffer which is divided into quadrants so that a batch transaction can be employed for regularly reloading source symbols into it quadrant-by-quadrant until the source to be compressed is exhausted (e.g., until the end of the current source file is reached). That reduces the number of I/O transactions that are required for maintaining a timely flow of source symbols for the compressor 62. In such an implementation, the quadrants are selected to be sufficiently large to effectively isolate the compression performed by the compressor 62 from the reloading of its input buffer 71.

A search and update logic 72 assembles and maintains a search tree organized data structure 73 which links the symbols within symbol positions i through i-w of the buffer 71 (i.e., the search window) to each other in accordance with the order of occurrence and which tracks the most recent occurrence of those symbol strings as successive symbols are shifted into, through and out of the search window. The cut-off depth of the links provided by the search tree data structure 73 suitably is selected to equal the maximum permissible copy length, thereby limiting the amount of memory required to store it and the processing time required to maintain it. Several other techniques that may be utilized for further reducing the size of the search tree 73 and the time that is required for updating it are described in further detail hereinbelow.

In operation, the search and update logic 72 employs the search tree 73 for determining whether there is a match anywhere within symbol positions i through i-w of the buffer 71 for the test symbol appearing at symbol position i+1. If a match is found, the logic 72 extends the test string by appending the symbol at symbol position i+2 to it and then determines whether there also is a match within the search window for this extended input symbol string. This is a reiterative process, whereby the search and updata logic 72 progressively supplements the test symbol string by extending it with one after another of the uncompressed symbols until a symbol that fails to extend the length of the longest existing match (i.e., a match terminating symbol) is encountered or until the existence of a match of maximum permissible copy length is identified. When either of these events occurs, the search and update logic 72 issues a report to a discriminator 74, which operates in accordance with the above summarized encoding rules to determine whether the symbol or symbols being tested are to be encoded as a copy codeword by a copy encoder 75 or are to be appended to a literal codeword by a literal encoder 76. To that end, the report provided by the search and update logic 72 identifies the length of the longest match that has been found and the search window position of the prior occurrence of the matched symbols (the positional information need not be reported if the length of the match is less than the minimum match length required for a copy). In this instance, the location of the lead or first symbol of the matching symbol string is reported to the copy encoder 75 as a displacement from symbol position i+1, but it will be evident that its location could be unambiguously identified in other ways.

A copy codeword is inserted into an output buffer 77 by the copy encoder 75 in response to a report from the search and update logic 72 which causes the discriminator 74 to conclude that a match of sufficient length to be encoded by such a codeword has been identified. The copy codeword is substituted for the symbols of the matched symbol string, so all of the symbols of the matched symbol string are shifted into the search window quadrant or sector of the buffer 71 before the discriminator 74 responds to any further reports from the search and update logic 72. To that end, a count corresponding to the length of each copy is loaded into a character skip counter of a counter controlled gate 78 for temporarily disabling the encoding logic 74–76 from producing further codewords while the symbols represented by the copy are being loaded into the search window sector of the input buffer 71. The count is decremented as each of the successive symbols of the matched symbol string is loaded into the search window, so the encoding resumes with the symbol following the matched string.

A literal, on the other hand, is initiated by the discriminator 74 when the search and update logic 72 fails to find a match of sufficient length to be encoded as a copy, even though the length of the literal is still unknown. Once a literal is initiated, the search and update logic 72 tests the extensions of successive ones of the uncompressed symbols as they are shifted into symbol position i+1 until it finds a match for an extended test symbol string of sufficient length to warrant interrupting the literal (e.g., at least three symbols long) or until the number of symbols that have been tested reaches the maximum permissible literal length. Whenever either of those events occurs, the literal encoder 76 inserts a literal codeword identifying the length of the literal into the output buffer 77 and then copies the accumulated symbols of the literal into the buffer 77 in serial order, thereby appending them to the literal codeword. The literal codeword and its appended literal symbols may be loaded into the output buffer 77 as soon as a match of sufficient length for a copy is found or, as in the illustrated embodiments, after the match for the copy has been extended to its ultimate length such that the copy encoder 75 is ready to issue a copy codeword.

Figures 4, 5:
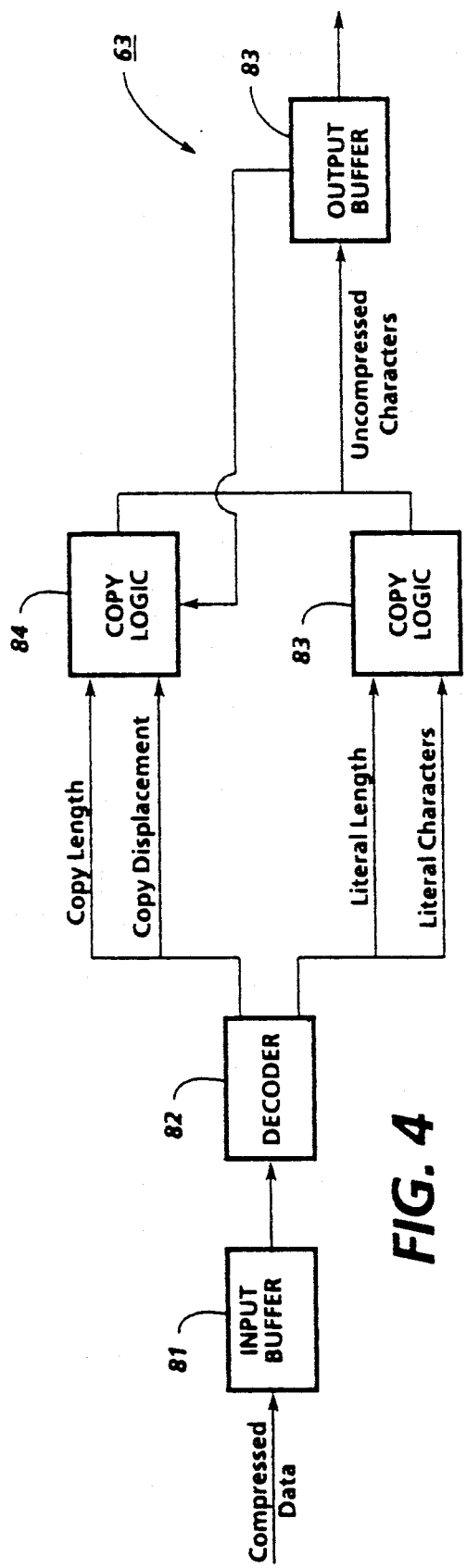
FIG. 4 is a block diagram of an expander for decompressing data compressed by the compressor shown in FIG. 3.
FIG. 5 illustrates the symbol-by-symbol parsing of a sample symbol string.
Figure 6A:
FIGS. 6A–6E diagrammatically illustrate the construction of a Trie search tree organized data structure.
Figure 6B:
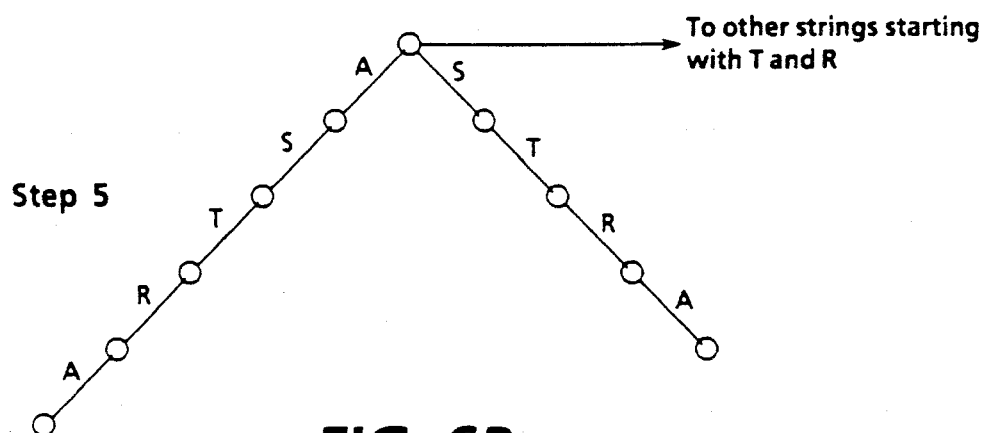
Figure 6C:
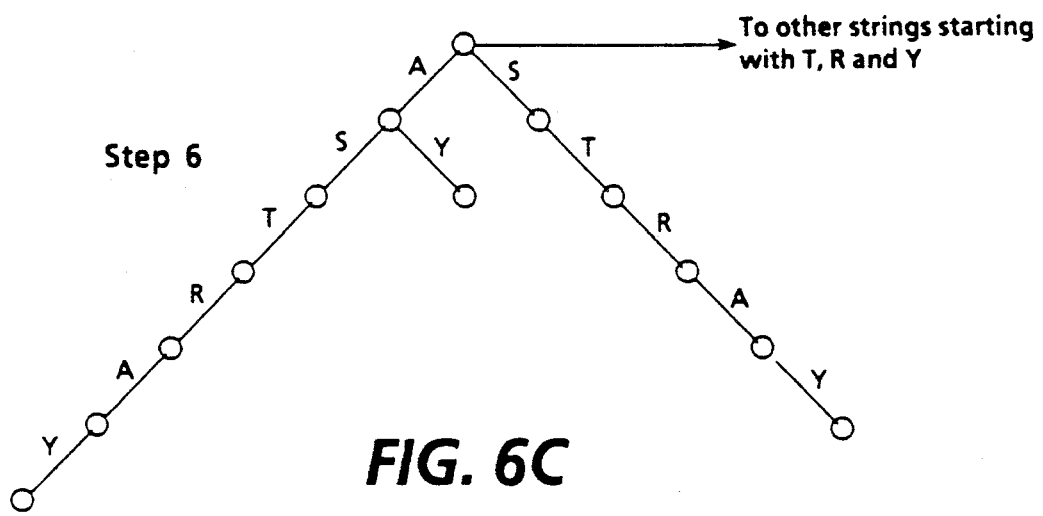
Figure 6D:
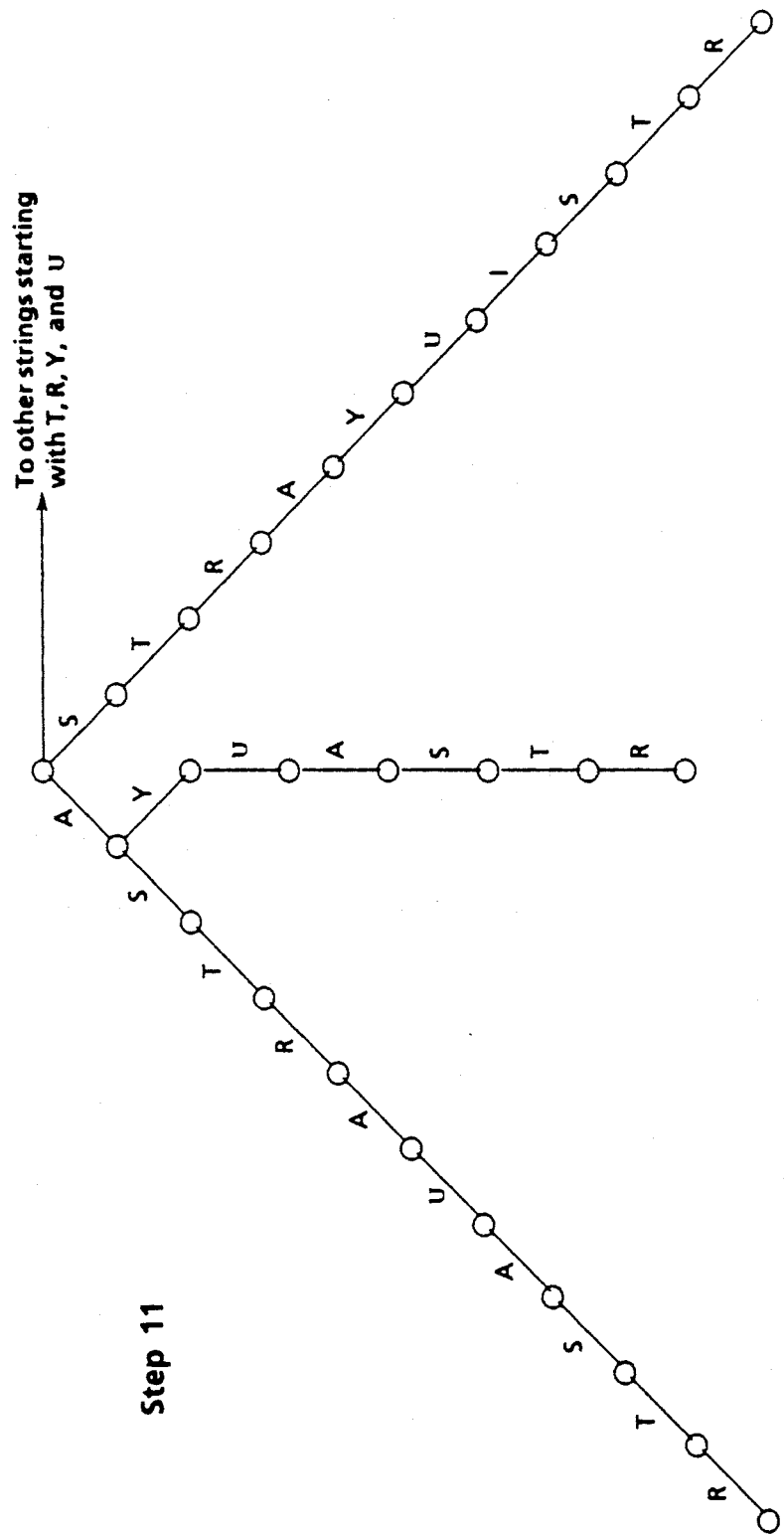
Figure 6E:
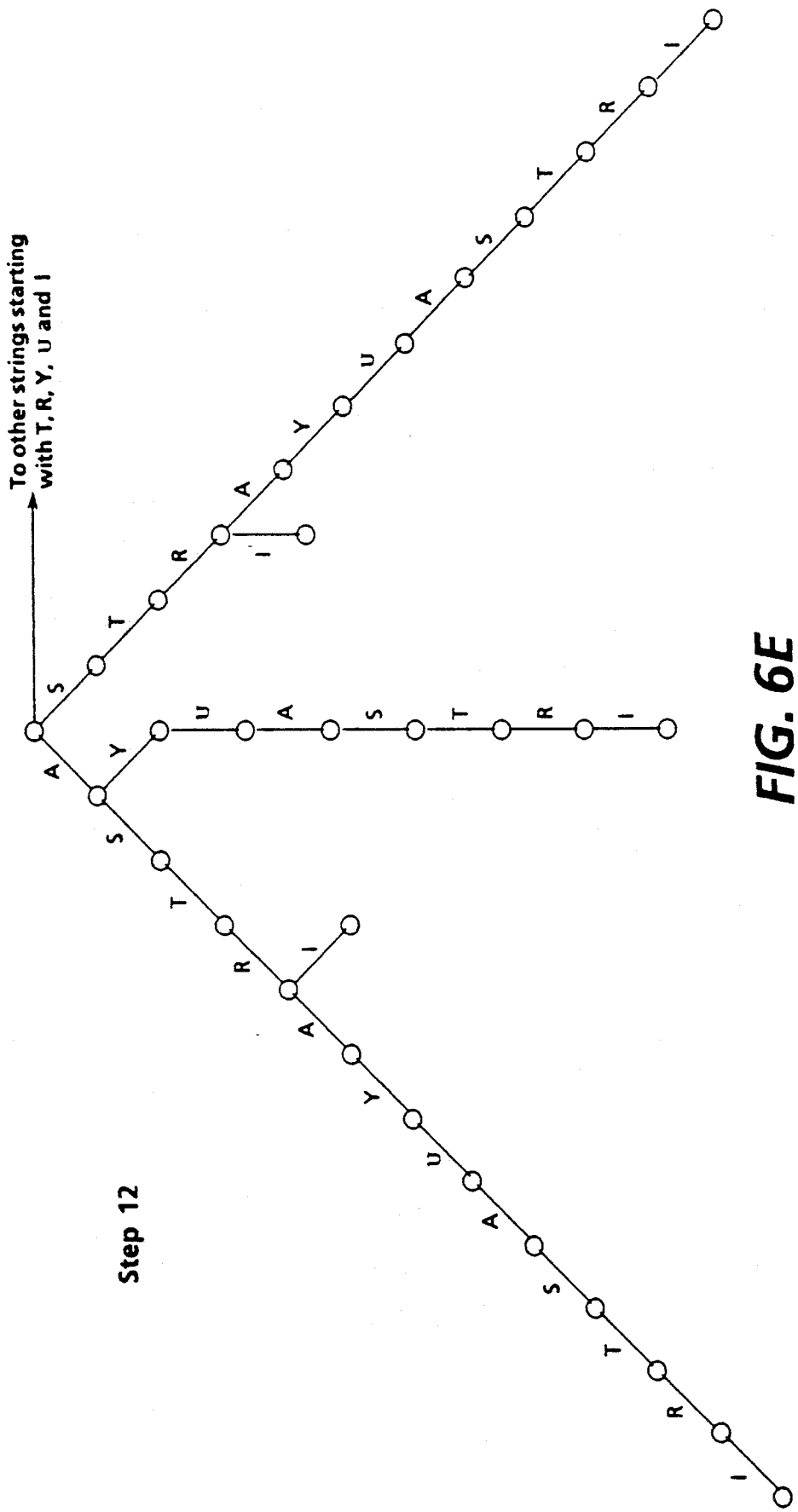
Figure 7A:
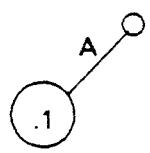
FIGS. 7A–7E diagrammatically illustrate the construction of a PATRICIA tree organized data structure.
Figure 7B:
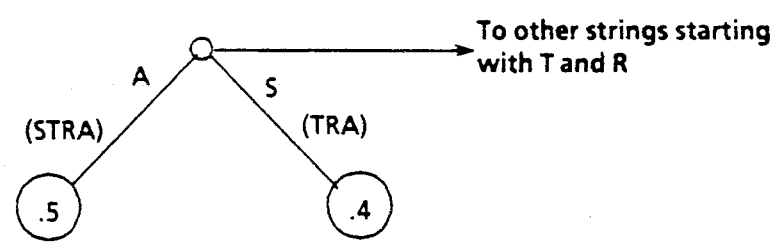
Figure 7C:
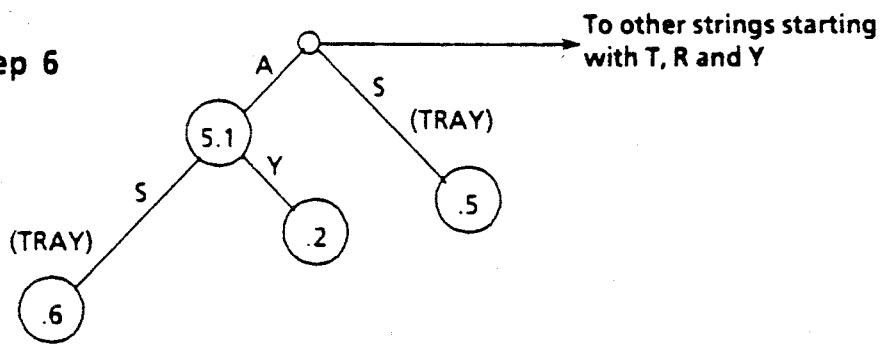
Figure 7D:
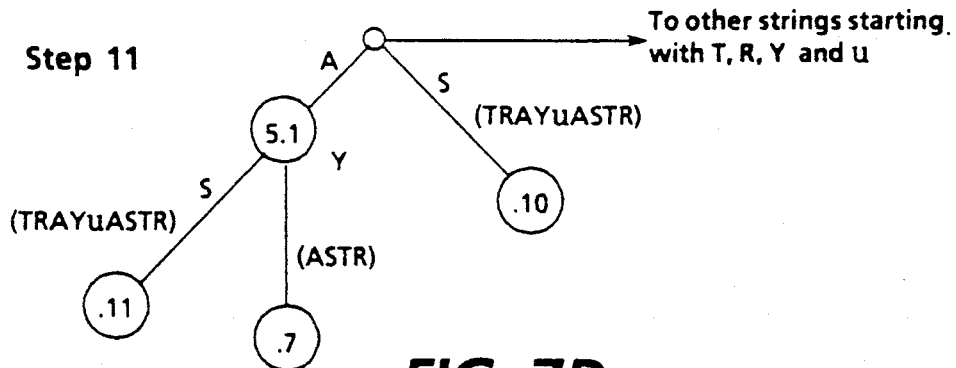
Figure 7E:
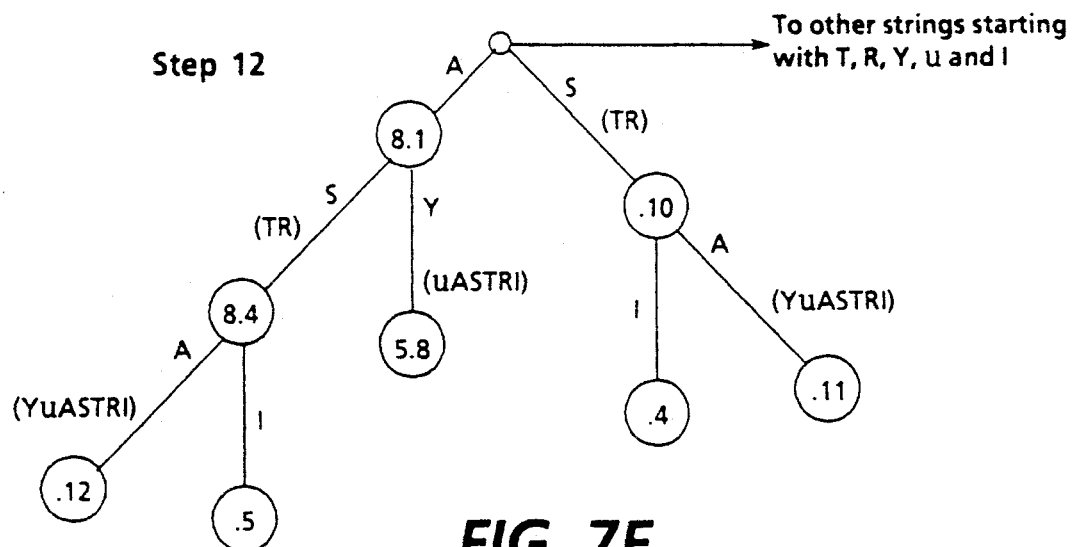

As shown in FIG. 4, for decompressing the compressed source data, the expander 63 comprises an input buffer 81 for supplying the compressed data to a decoder 82 at a suitable rate or as requested. The decoder 82, in turn, decodes the literal and copy codewords for a literal logic 83 and a copy logic 84, respectively. When a literal codeword is decoded by the decoder 82, the literal logic 83 responds to the decoded length of the literal, $x_l$, to serially load the next $x_l$ symbols directly into a FIFO output buffer 85. On the other hand, when a copy codeword is decoded, the copy logic 84 responds to its displacement, y, and length, $x_c$, for serially copying into the output buffer 85 a string of previously decompressed symbols, starting with the $y^{th}$ previously decompressed symbol in the buffer 85 and extending the copy from there through a string of $x_c$ progressively more recently decompressed symbols.

C. More on Search Trees

Advantageously, the search tree 73 branches in accordance with the "digits" of its keys to its "leaves," which are defined by the source symbols that are within the search window symbol positions i through i-w of the input buffer 71 at any given time. Focusing, for example, on the highly redundant English language text shown in FIG. 5, it will be evident that a search tree 73 which branches in accordance with the individual characters of any portion of the text that is within the search window symbol positions of the input buffer 71 is well suited for providing the pointers that are needed for locating prior occurrences of reoccurring symbols and symbol strings, provided that the pointers are updated during operation to account for the FIFO shifting of the compressed source symbols into, through and out of the search window. Symbols are shifted into the window via symbol position i immediately after it is determined whether they are to be associated with a literal or copy codeword as previously described, while older symbols are shifted out of the window via symbol position i-w when space occupied by them is needed for storing the more recently compressed symbols and symbol strings. Although the relative motion between the source symbols and the fixed length search window is most easily visualized as a physical shifting of the symbols with respect to the search window, it is to be understood that it may be implemented in software by employing pointers which are shifted with respect to the source symbols under softward control.

Referring to FIGS. 6A–6E, it will be evident that a Trie tree data structure (see D. E., Knuth, *The Art of Computer Programming. Vol. 3*: Sorting and Searching, Addison-Wesley, Second Printing, 1975, p 481) satisfies the basic functional requirements of the search tree 73. As is known, a symbol string is inserted into a Trie tree by descending down from the root of the tree one additional level for each successive symbol in the string. Consequently, the $j^{th}$ level of the tree branches in accordance with the $j^{th}$ symbol in any given symbol string, with the result that the tree inherently contains all of the necessary pointers for locating all symbols and symbol strings within the search window. However, a substantial amount of processing time is required to insert symbol strings into a Trie tree (i.e., the worst case insertion time for a file composed of n symbols is O(d.n), where d is the maximum permissible copy length. Moreover, the size of such a data structure grows to O(d.w), where w is the search window size, so a simple Trie tree data structure is likely to be too large for most practical applications of this invention.

Turning to FIGS. 7A–7E, a PATRICIA tree (see D. R. Morrison, "PATRICIA-Practical Algorithm to Retrieve Information Coded in Alphanumeric", *Journal of*

*the Association for Computing Machinery*, Vol. 15, No. 4, 1968 pp. 513-534) is a relatively compact alternative to the Trie tree. As is known, the internal nodes of a PATRICIA tree include pointers to the file it is indexing, so the data structure of such a tree need only include a single "digit" or symbol for each search path branch, thereby eliminating the superfluous internal nodes of a Trie tree (i.e., those with only one descendant). For instance, if the search tree 73 (FIG. 3) is a PATRICIA tree, the symbols parenthetically referenced on its arcs in FIGS. 7B-7E need not be explicitly included in the data structure because they do not affect the branching of the tree. Those symbols can be recovered, however, by scanning the symbols within the search window symbol positions identified by the position and level pointer pairs of the nodes for the arcs upon which they reside, so they are effectively represented by those arcs.

A classical PATRICIA tree requires only a single file access and comparison at the end of each search. However, when a PATRICIA-style search tree 73 is used to carry out the present invention, it generally is preferable to scan the symbols that are represented by the arcs traversed during the insertion of symbol strings into the tree, so that the position pointers within the nodes to which those arcs lead can be updated while descending downwardly into the tree. Typically, the "digits" that are inserted into the search tree 73 are bytes (e.g., eight bit characters) so a branching factor as large as 256 can be provided. As a general rule, however, the nodes do not have that many descendants, so the amount of space that must be reserved within the nodes of the tree 73 to define the branching of its search paths may be reduced by hashing its arcs.

A PATRICIA tree is an acceptable choice for the search tree 73 if sufficient compression can be achieved while employing a search tree with a relatively shallow cut-off depth. As previously pointed out, such a tree is defined by a reasonably compact data structure, but it relies on essentially the same insertion process (i.e., return to the root and then descend into the tree) as the Trie tree. Consequently, the time required for inserting longer symbol strings into a PATRICIA tree tends to limit the practical application of that type of tree to embodiments in which the maximum permissible copy length is relatively short (again, the worst case insertion time for a file of n symbols is $O(d.n)$, where the depth, d, required of the tree is equal to the maximum permissible copy length.

Figure 8:
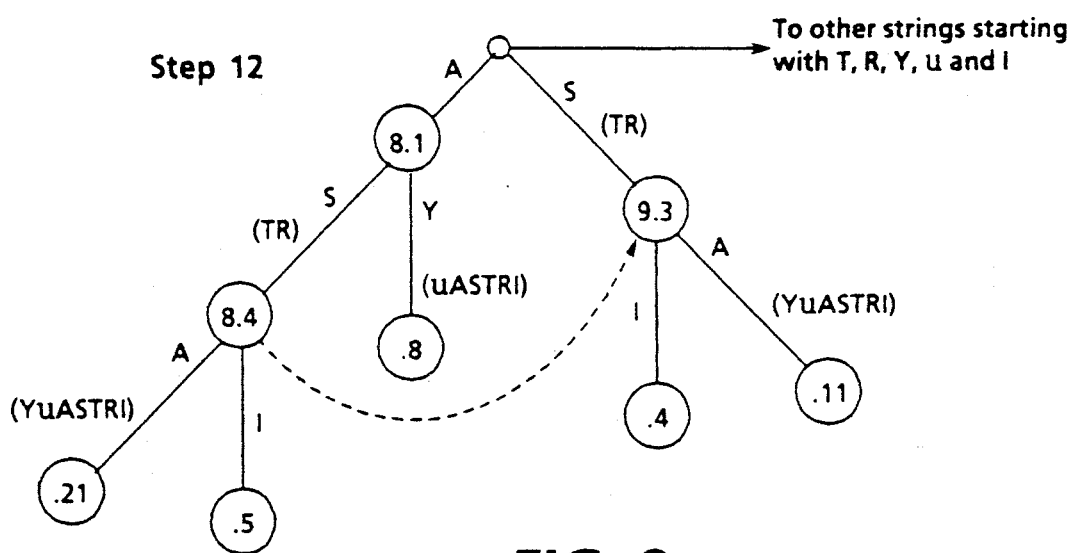
FIG. 8 diagrammatically illustrates a suffix tree organization of the data structure shown in FIG. 7E.

Fortunately, a slightly modified suffix tree, such as shown in FIG. 8, can be utilized for embodiments in which it is necessary or desirable to be able to insert symbol strings into the search tree 73 (FIG. 3) in $O(n)$ time. As described by E. M. McCreight, "A Space-Economical Suffix Tree Algorithm," *Journal of the Association for Computing Machinery*, Vol. 28, No. 1, 1976, pp. 262-272. A suffix tree is similar to a PATRICIA tree, except that the internal nodes of a suffix tree include pointers which link them to the nodes for their suffixes, such as illustrated by the dashed line in FIG. 8. More particularly, turning to the generalized suffix tree shown in FIG. 9, it will be seen that its internal nodes for suffix extended symbol strings, such as the string aX, include pointers to the nodes representing their suffix extensions, such as X. Thus, if a suffix extended symbol string starting at position p in the search window has just been inserted at level 1 of a suffix-style search tree 73, the string starting at position p+1 can be inserted into the search tree, without returning to its root, because there always is a nearby suffix pointer leading from the node representing a suffix extended symbol string (e.g., the string starting at position p) to the node for its suffix extension (e.g., the string starting at position p+1).

Figure 9:
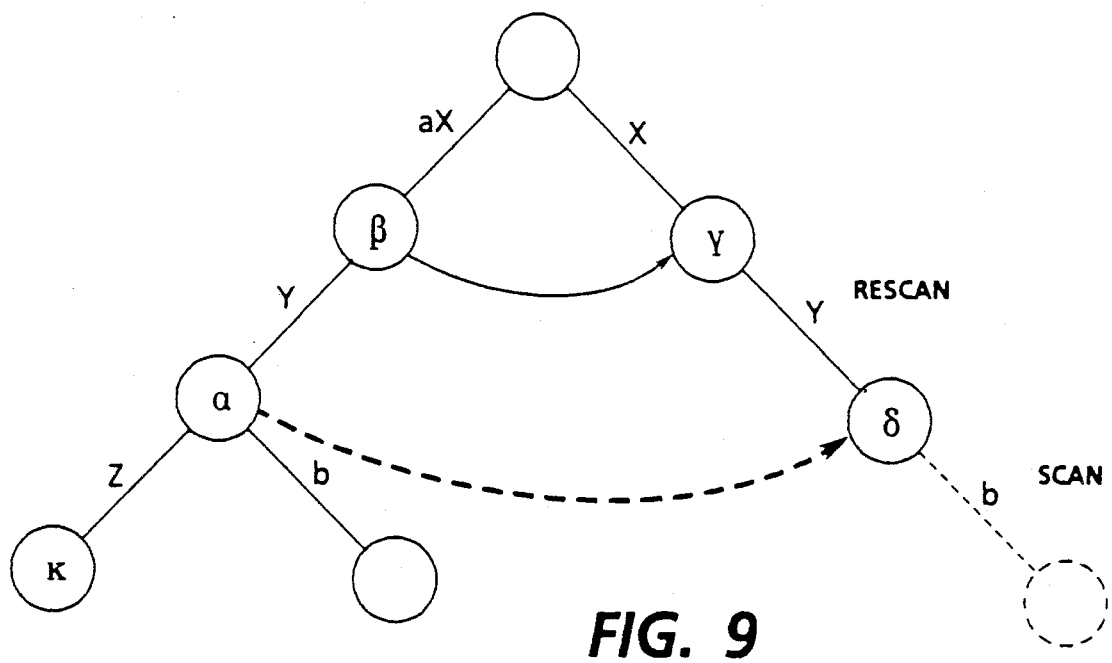
FIG. 9 is a generalized representation of a suffix tree.

Considering FIG. 9 in some additional detail, it will be seen that it depicts a situation in which a match has been found on the previous iteration for a string composed of aXY, where a is a single symbol, X and Y are strings composed of one or more symbols, and b is the first unmatched symbol following Y. To illustrate a further complication that occurs from time-to-time, it has been assumed that $\alpha$ is a new internal node which has just been added to the tree to discriminate between the search path for the string aXYb and the search path for the string aXYZ, where Z does not begin with b. In view of that assumption, it will be understood that it still is necessary to compute the suffix link for the node $\alpha$.

In accordance with McCreight's above-identified teachings, the next string, XYb, can be inserted into the tree by initially moving up the tree (i.e., toward its root) from the node $\alpha$ (which does not yet have a suffix link) to the next higher node $\beta$, thereby stripping Y from the string aXY. The node $\beta$ necessarily represents the string aX, so its suffix pointer is followed to the node $\gamma$, which by definition represents the suffix X of the string aX. Having found the node representing X, the suffix extended symbol string, XYb, can now be inserted by descending into the tree, first to "rescan" the string Y and then to "scan" still further down into the tree to find the longest existing match for the symbol string beginning with the substring XY. If there is an existing match for its suffix extension, XYb, the "rescan" will terminate on the node, $\delta$, corresponding to the substring XY. On the other hand, if there is no match for the suffix extended string, XYb, the node $\delta$ will be created by breaking an arc representing a string beginning with Y to insert the new node $\delta$ with Y represented by its incoming arc. In either event, the node $\delta$ branches to the symbol b and represents the suffix, XY, for the previous symbol string, aXY. Thus, a pointer to it is entered into the suffix link field of the node $\alpha$, thereby restoring the invarient that every internal node within the suffix tree, with the possible exception of the one most recently created, has a suffix link.

Fortunately, the symbol strings represented by the arcs that are "rescanned" during the above described process (e.g., the string Y) need not be compared against the corresponding symbols of the string being inserted into the tree because the identity of those two symbol sets was established during the prior iteration (i.e., while the suffix XY of the symbol string aXY was being inserted into the tree). This prior knowledge permits symbol strings to be inserted into a suffix-style tree 73 in essentially linear time because only their most recent suffix extensions need to be compared against the contents of the search tree.

In accordance with one of the features of this invention, several important modifications are made to the data structure of the suffix-style search tree described by McCreight, supra, to limit its size and to reduce the time required for maintaining it. As previously pointed out, the leaves of the tree are serially shifted into, through and out of the search window symbol positions i through i-w of the buffer 71 (FIG. 3) on a FIFO basis, thereby providing an orderly procedure for maintaining the most recently compressed portion of the source data within the fixed length search window. Furthermore, "son count" fields are included in the internal nodes of the tree for identifying nodes that are to be deleted. As will be appreciated, internal nodes are added to the tree only when they are needed to discriminate between alternative search paths. A "parent node" which has only one remaining "son" does not provide any search path discrimination. Thus, whenever the value in the son count field of any node drops to one, the node is deleted and the symbol or symbol string represented by its sole remaining or "orphaned" son is combined with the symbol or symbol string represented by the arc from the next higher level or "grandparent" node.

Still another departure from the known suffix-style search tree is that provision is made for updating the position pointers in the internal nodes of the suffix tree, without necessarily requiring a return to the root of the tree to accomplish that. More particularly, in keeping with one of the more detailed features of the present invention, a "percolating update" may be employed for updating the pointers in the internal nodes of a suffix tree, thereby maintaining those pointers on the suffix leaves of the tree as the leaves (i.e., the recently compressed source symbols) are shifted through the search window. To that end, each internal node of the tree includes a single "update" bit in addition to its aforementioned position and level pointers, suffix pointer, and son count field. Furthermore, whenever a new symbol string is inserted into the tree, the current position in the scan window of the initial or lead symbol of the string is propagated upwardly to the parent node for the new leaf of the just inserted symbol string, whereby (1) the current position of the lead symbol of the most recent occurrence of the given symbol string is written into the position field of its leaf parent node to distinquish that occurrence from any prior occurrences of the same symbol string which still may be within the search window, and (2) the state of the update bit for the parent node of the new leaf is reversed. If the update bit of the parent node is switched from a "false" state to a "true" state, there is no further propagation of the position update. However, if the update bit of the parent node of the new leaf is switched from a "true" state to a "false" state, the current search window position of the lead symbol of the newly inserted symbol string propagates upwardly into the tree (back towards its root) to update the position fields of all nodes on the search path for the symbol string, until the update reaches a higher level node having a "false" update bit. This updating process is called a "percolating update" because the propagation of the update is terminated at the first node (the lowest level node) which receives an update while its update bit is in a "false" state. The position field of such an update terminating node is updated to point to the lead symbol of the newly inserted symbol string, and the update bit of the node is switched to a "true" state, thereby conditioning the node for propagating the next update it receives to its parent node. Finally, the last symbol of the newly inserted symbol string is shifted into the search window, thereby causing the oldest leaf of the search tree 73 (FIG. 3) to be deleted (i.e., shifted out of the search window) if the search window is full.

As previously pointed out, the deletion of leaves from a suffix-style search tree 73 desirably triggers the deletion of any parent nodes that are left with just one son. For that reason, the position of a parent node that is being deleted from such a tree also is percolated upwardly toward the root of the tree more or less in accordance with the above-described process (i.e., the position pointer of the node being deleted always is written into the position field of the next higher level node, but is only conditionally propagated upwardly from there depending upon the state of the update bits of the higher level nodes). The basic distinction is that during a percolating update from a deleted node, the existing position pointer for each of the higher level nodes which receives such an update is compared against the position pointer of the proposed update, thereby permitting the most recent of those two pointers to be selected (1) as the position pointer for the node receiving the update, and (2) as the proposed update for the next higher level node if the update is permitted to propagate to it.

In the worst case, all nodes on the path from the parent node for the suffix leaf or final symbol of a newly inserted symbol string to the root of the tree may have "true" update bits, thereby causing an update to percolate all the way up to the root of the tree. However, it can be shown that the above-described percolating update process can be performed in a constant amount of timer per symbol or character when the time required to perform it is amortized over all of the leaves of the search tree 73. Even more importantly, it also can be shown that the process is effective in maintaining valid position pointers in all of the internal nodes of the search tree 73, so that the nodes are accurately referenced to the search window symbol positions which contain the symbols they represent.

Still other implementations of the search tree 73 will suggest themselves. For example, it will be evident from the foregoing discussion of Trie trees and PATRICIA trees that the percolating update provided for the suffix tree could be avoided by simply returning to the root of the tree for the insertion of each symbol string. In that event, the internal nodes of the tree would not require any update bits, and it would be unnecessary to perform updates when nodes are deleted. Likewise, suffix links are not essential for locating suffix nodes during the insertion of symbol strings into such a search tree, although they significantly reduce the average time required to perform that task. In their absence, it would be possible to start at the suffix leaf for a given string and to then follow parent pointers back toward the root of the tree until reaching the suffix node. As will be appreciated, the suffix leaf for a given symbol string is easily located because it is the first unmatched symbol following a string, such as the string aXY (FIG. 8), which is known to have a match originating at a predetermined symbol position, p, in the search window. Moreover, the suffix node for such a symbol string can be identified by using the parent pointers to move upwardly from the suffix leaf toward the root of the tree an appropriate number of levels as determined by the length of the string that is being inserted, thereby preserving the advantage of not having to return to the root of the tree for the insertion of each symbol string (as will be appreciated, the cost of moving through the search tree is not uniform because hash table look-ups normally are required to move down from level-to-level toward the suffix leaves). When, however, the maximum permissible copy length is long, this alternative suffix node based string insertion process is undesirably slow in the worst case. Similarly, if some parts of the search tree 73 are deep, an excessively long average update time is required when all updates must propagate to the root of the tree. Therefore, the suffix links and the percolating update usually are preferred.

and copies to which they are assigned (see the codeword layouts):

| Name | Size (bits) | Codeword Layout | Indicator (binary) | Lengths Covered for Various Positions | | |
|---|---|---|---|---|---|---|
| | | | | [0 ... 256] | [256 ... 4k] | [4k ... 10k] |
| SC (short copy) | 12 | 2i.2l.8d | 00 | [2 ... 5] | | |
| CS (short/mid copy) | 16 | 2i.2l.12d | 01 | [6 ... 9] | [2 ... 5] | |
| CL (long/mid copy) | 16 | 3i.1l.12d | 100 | [10 ... 11] | [6 ... 7] | |
| L1 | 4 | 4i | 1010 | 1 | | |
| L (literal) | 6 | 4i.2l | 1011 | [2 ... 5] | | |
| LC (long copy) | 20 | 2i.4l.14d | 11 | [12 ... 23] | [8 ... 19] | [3 ... 14] |
| VLC (very LC) | 23 | 5i.4l.14d | 11110 | [24 ... 39] | [20 ... 35] | [15 ... 30] |
| VVLC | 27 | 6i.7l.14d | 111110 | [40 ... 135] | [36 ... 131] | [31 ... 126] |
| VVVLC | 30 | 8i.8l.14d | 11111011 | [136 ... 391] | [132 ... 387] | [127 ... 382] |
| LL (long literal) | 10 | 6i.4l | 111111 | [7 ... 22] | | |

D. Extended Embodiments

1. Statistically Sensitive Encoding

As will be appreciated, an efficient use of fixed length literal and copy codewords requires a careful balancing of the length of those codewords against the average lengths of the literals and copies into which the source data tends to decompose. Increasing the size of the search window tends to increase the average length of the matching symbol strings that can be found, but the size of the position pointers required for specifying the individual symbol positions within the search window also increases. These larger pointers may reduce the compression that is achieved if they are employed indiscriminately because the pointers referencing the more recent symbol positions are more likely to be used. Furthermore, shorter literals and copies are more probable than longer literals and copies. Accordingly, statistically sensitive variable length literal and copy codewords advantageously are utilized to carry out the present invention when increased compression is desired.

Figure 10:
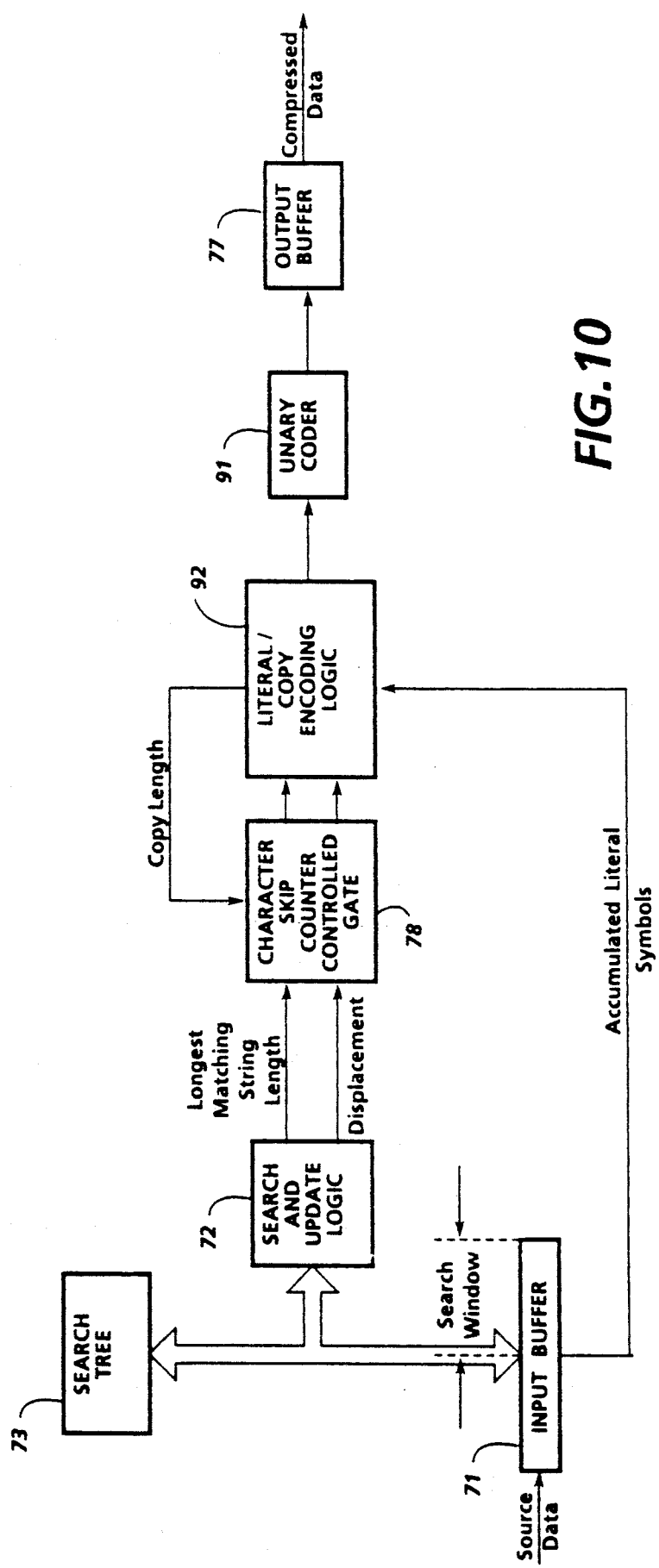
FIG. 10 is a schematic block diagram of a compressor having a unary coder.

Various techniques may be employed for providing such statistically sensitive variable length codewords, for example, adaptive Huffman encoding or arithmetic coding of the literal lengths and the copy lengths and displacements reported to the encoding logic 74 (FIG. 3) could be used. However, such coding generally is slow, and it would merely yield a secondary adaptive advantage because the fixed length search window of the compressor 12 (FIG. 3) already causes it to adapt to the source. Still another approach is to pre-assign an extended family of unique codewords of different bit lengths to the encoding of literals of various lengths, as well as to the encoding of copies of various lengths and displacements. In that event, short literals and short nearby copies typically are encoded by assigning relatively short codewords to them, while longer literals and longer and/or more remotely displaced copies are encoded by assigning longer codewords to them, thereby tailoring the lengths of the codewords used to a predetermined model of the frequency distribution of the literal and copy components into which an average source decomposes. A representative family of mutually distinguishable codewords (see their introductory indicator bit sequences) ranging in length from four to thirty bits long (see their sizes) are set forth below, together with the encoding tasks to which they are assigned (see their names and the string lengths covered by them within different displacement ranges of 16k long search window), as well as the layouts which enable these codewords to uniquely encode the literals However, in keeping with one of the more important features of this invention, it has been found that one of the more straightforward and effective techniques for generating statistically sensitive, variable length, literal and copy codewords is to provide a unary coder, such as shown at 91 in FIG. 10, for supplying linear progressions of <start, step, stop> unary codes for representing the lengths of the literals and the lengths and displacements of the copy. As will be seen, the encoding rules or policy are enforced by encoding logic 92 located ahead of the unary coder 91, but otherwise the compressor shown in FIG. 10 is sufficiently similar to the compressor shown in FIG. 3 to permit the use of like reference numbers to identify like parts.

As a matter of definition, a <start, step, stop> unary code comprises a unary code for specifying the bit length of the field in which the length of the literal or the length or displacement of the copy is being digitally recorded, followed by the value field itself. The value field is, in turn, constrained to contain no fewer bits than the specified "start" number and no more bits than the specified "stop" number. Moreover, the bit length of the value field incrementally varies as a linear function of the specified "step" parameter to define a linear progression of variable length codes. Therefore, the nth codeword of such a code comprises n−1 "1's" terminated by a single "0" (i.e., the unary field length indicator) followed by a value field of size (start+(n−1) step). Integers are laid out sequentially through these different size codewords. For example, the four distinct length codewords of a <3,2,9> unary code map onto the integer counting numbers as follows:

| Codeword | Range |
|---|---|
| 0xxx | 0–7 |
| 10xxxxx | 8–39 |
| 110xxxxxxx | 40–167 |
| 111xxxxxxxxx | 168–679 |

As will be seen, the single "0" terminator for the unary field length indicator can be omitted when the bit length of the value field is equal to the given "stop" size. A simplified pseudo-code computational procedure for generating unary codes is set forth in Appendix B, which is hereby incorporated by reference, although it is to be understood that a table look-up procedure is a viable alternative for encoding unary codes. Furthermore, Appendix C also is incorporated by reference because it is a Cedar source code listing for a textual substitution data compression system which applies unary coding to literals and copies that are identified by decomposing the source data in accordance with the logical rules outlined above. It is to be understood, however, that unary coding may be utilized for various types of run length or string length dependent data compression for capturing the length over which the compressible coherency exists (and/or the length over which the incompressible incoherency exists) and, in the case of a textual substitution style data compression system, the location at which the redundancy can be found. Even more generally, unary coding may be used in digital data compression system to provide variable length coding of numerical values, including run lengths, copy lengths, copy displacements, literal lengths, etc.

Figure 11:
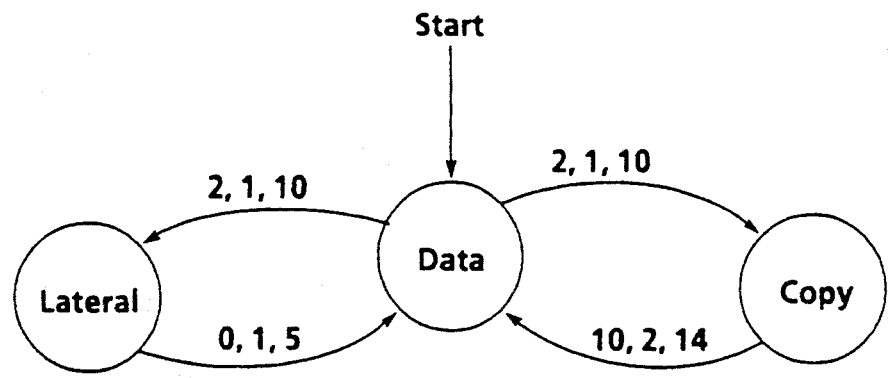
FIG. 11 is a finite state diagram for illustrating the operation of the unary coder shown in FIG. 10.

As will be appreciated, various factors may influence the selection of the <start, step, stop> unary codes for coding the literal lengths and the copy lengths and displacements of data compressed in accordance with the above-described encoding rules. For example, as illustrated by the simplified finite state machine (FSM) shown in FIG. 11, a <2, 1, 10> unary code may be employed for encoding copy length, thereby limiting the maximum permissible copy length to 2044 symbols. A copy length of zero signals a literal; the length of which is then encoded using a <0, 1, 5> unary code, so the maximum permissible literal length is 63 symbols. If, on the other hand, the copy length is non-zero, the copy displacement may be encoded with a <10, 2, 14> unary code to point to copies originating anywhere within a 21,504 symbol position wide search window. In practice the maximum copy and literal lengths typically are selected to avoid wasted states in the unary progressions. A similar technique is sometimes also used for avoiding wasted states in the unary coding of copy displacements.

The unary codes employed may also be refined (not shown) to avoid wasted states. For instance, the previously described rules for decomposing source data into literals and copies ensure that a literal of less than maximum permissble literal length is never immediately followed by either another literal or a copy of length two. Thus, whenever such a non-maximum length literal is encoded, the <2, 1, 10> code may be shifted down by two for the encoding of the copy which must follow such a literal, with the result that a code value of zero then means a copy length of three, a code value of one means a copy length of four, and so forth.

Another refinement that is of value during start-up is to phase in the copy displacement encoding as the search window is being filled. For example, such a phase-in may be realized by using a <10−x, 2, 14−x> unary code for copy displacements, where x is initially set equal to ten and is then decremented to zero when and as required to enable the displacement pointer to identify all window positions containing previously compressed symbols.

Still another technique that may be utilized to avoid wasted states in the copy displacement encoding is to shrink the largest field in its unary progression until it is just large enough to provide a family of "sparse" codewords for uniquely identifying each of the different displacement values that field is required to represent. Thus, if there are a total of v values to be encoded in the largest or "stop" size field of a <10−x, 2, 14−x> unary code, "sparse coding" of that field causes the smaller of those v values to be encoded with $\log_2 v$ bits and the larger of them to be encoded with $\log_2 v$ bits. As will be appreciated, such sparse coding avoids the need for using 14−x bits for encoding each of the v values, thereby reducing the bit size of the copy codewords with the largest displacement values.

To further illustrate this sparse coding technique, consider the coding of one of six values. If a 3-bit field is used for coding the value, two of the eight possible states will be 2 wasted states. But, there are no wasted states if the values 0 and 1 are coded in 2 bits and the values [2 . . . 5] in 3 bits as follows:

| Value | Code |
|-------|------|
| 0 | 00 |
| 1 | 01 |
| 2 | 100 |
| 3 | 101 |
| 4 | 110 |
| 5 | 111 |

Typical sparse encoding and decoding procedures are set forth below:

```
Encode:  PROC[value,nFreeValues,nBits: CARDINAL] = {
         IF value < nFreeValues THEN Output[value,nBits -1]
         ELSE Output[value + nFreeValues,nBits];
         };
Decode:  PROC [nFreeValues, nBits: CARDINAL] RETURNS
         [value: CARDINAL] = {
         IF nFreeValues = 0 THEN value←Input[nBits]
         ELSE {
         value←Input[nBidts - 1];
         IF value > = nFreeValues THEN value ← value +
         value − nFreeValues + Input[1];
         };
```

2. Faster Compressors

The foregoing compressors format the compressed data so that it can be expanded relatively rapidly by means of expanders which have limited storage capacity, such as the expander 63 (FIG. 5). Therefore, they are particularly well suited for applications in which compression speed is less important than simplifying the design and optimizing the performance of the expander, such as when it is desired to produce a mass release of software in compressed form on floppy disks for distrbution to and expansion by the ultimate users. In addition, the foregoing compressors lend themselves to a natural and reasonably straightforward hardware implementation. For example, in a VLSI hardware embodiment, the search tree is eliminated and replaced by a number of comparators, which operate simultaneously on many characters in the search window to determine the longest match. Suitably, the symbols contained by the search window are stored on a semiconductor memory chip, so no external memory references are required while determining the longest match. Partly because no external memory references are required, this kind of compressor can run extremely fast and achieve excellent compression on a wide variety of data. In addition, because it fits on a single chip, it has advantages in applications where a "stand alone" data compression function is wanted, without any requirement for general purpose computing functions.

However, there are other situations in which faster software compressors may be preferred, such as when files are to be archived in compressed form. Thus, in keeping with still another feature of the present invention, the compression speeds of the above-described fixed length codeword and unary coded variable length codeword embodiments of the present invention can be increased significantly by restricting copies to begin on a boundary defined by the initial symbol of a prior copy or by a symbol that was previously inserted into the compressed data stream as a literal. Rather than having one leaf in the search tree 73 (FIG. 3) for each symbol in the search window as in the previously described compressors, these faster embodiments of the invention have only one leaf in the search tree 73 for each copy codeword and each literal. This reduces the computation required to search and update the tree 73, thereby significantly increasing the compression speed for average data. Matches originating at the second or subsequent symbols of a previous copy are ignored, so the "longest available match" may or may not be the longest match anywhere within the search window. It, therefore, will be evident that the increased compression speed provided by this approach is achieved at the cost of slowing the rate at which the system adapts to changes in the source data. In addition, for reasons which will become apparent, the complementary expander for these faster compressors is slowed somewhat and requires more storage.

One of the advantages of constraining all copies to originate on a prior copy or literal is that the position pointers for locating the prior occurrences of the reoccurring symbol strings can be compressed because they need only be able to identify the beginning of the $y^{th}$ previous codeword or literal character emitted. For example, "compressed displacements" can be implemented as follows: First, an array of storage elements of length equal to the window size is provided for storing pointers into the compressor input buffer. Each element of this array points to a different one of the copy codewords or literal characters issued by the compressor, so there is a one-to-one correspondence between leaves in the search tree 73 and elements in this array, and every internal node in the tree identifies the array element corresponding to one of its descedent leaves. Next, copy displacements are measured in terms of the number of array elements between the one corresponding to the leaf of the matched symbol string (i.e., the symbol string for which the copy is being substituted) and the array element corresponding to the leaf or internal arc upon which the longest match was found. In other words, copy displacements are measured in a "fixed length window" as in the previous embodiments, but the position in the character buffer of the lead symbol of a prior occurrence of a reoccurring symbol string is determined by going "indirectly" through this array of pointers, rather than by directly addressing the "search window" symbol positions. Thus, the size of the reference pointer array is fixed, but the length of the search window may expand and contract depending on composition of the recently compressed data. Copy lengths are still measured in symbols, so the preceding description of the measurement and encoding of copy lengths are applicable to these modified embodiments. Appendix D, which is hereby incorporated by reference, is a Cedar source code listing for a compression system based on the above-described compression rules in combination with compressed displacements and unary coding.

Symbol strings are inserted into the search trees 73 (FIG. 3) of these faster compressors by starting at the root of the tree on each iteration. The strings can be inserted in linear time because they are only inserted on existing codeword/literal character boundaries. Suffix pointers and propagating updates are unnecessary, so the search tree 73 (FIG. 3) for these embodiments preferably is a relatively simple PATRICIA tree (see FIGS. 7A–7E). It is to be noted, however, that it is useful to create an array of permanent nodes for all symbols at depth 1 of a PATRICIA-style search tree 73 for these embodiments. That can be done, even though the search window may not contain a symbol corresponding to each of these permanent nodes at all times, because a copy of length 1 is never issued. If such a permanent array of nodes is provided for the search tree 73, symbol strings may be inserted into the tree by indexing into the premanent node array based on the first symbol of the string that is being inserted. Thereafter, the insertion process typically relies on hash table look-ups and arc comparisons to descend deeper into the tree as previously described in connection with the use of PATRICIA-style search trees in general. Inasmuch as all nodes on the search path for any symbol string inserted into the tree are passed while the string is being inserted, the updated search window symbol positions for the symbols represented by those nodes can be written into the position fields of the nodes while descending down into the tree during the insertion process.

Constraining copies to originate with symbols that begin prior copy codewords or with symbols contained by prior literals reduces the ability of these modified compressors to capture the local coherence of the source data, but it permits the use of compressed pointers of relatively modest bit size for reaching relatively far back into the previously compressed source data, thereby making it feasible to use larger search windows to provide longer matches. This is advantageous for source data having a natural word structure, such as text. But, the foregoing constraint may be found to be undesirable for the compression of source data having a substantial amount of highly localized coherence, such as usually exists, for example, when the source represents a scanned image.

3. Additional Variations

Several variations on these schemes may be employed for updating the search tree 73 (FIG. 3) more frequently than on every prior copy/literal boundary. For example, a leaf could be added to the search tree 73 between the symbols represented by each length 2 copy codeword, and/or a leaf could be inserted into the search tree following the final symbol of every symbol string represented by a length 3 copy codeword. Indeed, any variation of inserting leaves into the tree intermediate the extremes represented by the foregoing compressors (in one of which a leaf is entered into the tree for every symbol, and in the other of which a leaf is entered once per copy codeword and once per literal character) is feasible within the general framework of this method. Some increased compression is likely to be achieved by using these and other techniques for increasing the ability of these faster compression systems to capture the local coherence of the source data, but their compression and expansion speeds would be reduced. There are also variations in which the tree is frozen at some point and not updated, so additional source symbols thereafter are encoded as copies and literals on the basis of the static data structure of the search tree, but the tree is not updated for the string just coded. In that event, the compression may fall off due to non-stationary statistics of the source data, but cycling of the tree can be resumed if need be. This approach might be used in applications where the highest speed is required, though it is likely to result in lower compression.

There also are variations on either of the two foregoing methods in which the window is primed or initialized with useful symbols, so that the compression of the earliest part of the source can be improved. While this is likely to improve compression when the source data resembles the priming data, it is slightly more complex and will worsen compression when the source data does not resemble the priming data.

In addition to variations on when strings are added to or removed from the search tree, there are variations on the data structures used in a software embodiment. In Appendix C we have used a suffix tree in which the arcs are inserted into a chained, circular hash table. It will be appreciated that in a hardware embodiment, no tree is required, and only the window itself is central to the compression method. It will also be appreciated that in a software embodiment many other kinds of hash tables, lists, or other data structures could be used to implement a suffix tree. Furthermore, it will be appreciated that the suffix tree could be replaced by the simpler PATRICIA tree, though we believe that this implementation is not as good; or it could be replaced by a binary tree, sorted list, or other data structure. Such variations are also possible for Appendix C. All of these variations are within the capabilities of a person skilled in the art of programming.

Additionally, it will be appreciated that, while the implementations in Appendices A, C and D employ 8-bit symbols or characters, it is possible to implement equivalent compressors using other symbol sizes.

Still further, it will be understood that while the embodiments in Appendices A, C and D are "greedy" in the sense that their copy codewords always refer to the longest match found in the window, it is within the capabilities of a person skilled in the art to implement a variation in which a match shorter than the longest match is sometimes encoded, if it can be represented by a shorter codeword than the longest match. Such a variation is likely to be slower than the "greedy counterpart methods, but it may achieve slightly higher compression on average (and, in the worst case, it may achieve much higher compression).

Moreover, the two foregoing compressors employ particular policies for selecting between Copy and Literal codewords and for deciding at what point to terminate a Literal codeword in favor of a Copy. It will be appreciated that many other polices are possible and implementing any of these is within the capabilities of a person skilled in the art.

Finally, while the embodiment of Appendix C codes copy length and displacement independently using unary <start, step, stop> codes, it is possible to use variations where the unary or other encoding of copy length is dependent upon the already-encoded copy displacement or where the unary or other encoding of copy displacement is dependent upon the already-encoded copy length. Indeed, still other variations will suggest themselves, including the use of a single prefix code for determining the coding of both copy length and copy displacement (see the fixed length encoding discussed hereinabove). All of these variations are within the capabilities of a person skilled in the art of programming, and particular choices would be governed by simplicity of implementation and the statistical characteristics of representative source data samples.

4. Improving the Compression Ratio

The encoding of the compressed data by the above-described compressors is suboptimal because the compressed data may contain multiple encoded instances of identical symbol strings within the addressable span of the search window, even though only one instance of each symbol string is required to permit all necessary copies to be made. The search tree data structures do not, however, waste space because reoccurring symbol strings share common search paths within them.

Therefore, to improve the compression ratio, the encoding may be performed using copy codewords that are directly based on the search tree data structure, such as the structure of a PATRICIA tree (FIGS. 7A-7E). For example, a single bit prefix ("0" or "1") may be employed for distinguishing between copy codewords representing matches terminating on any of the leaves of such a tree (a LeafCopy) and matches terminating on internal arcs of the tree (a NodeCopy). Identical search trees are constructed in the compressor and expander, with the expander using the codewords it receives from the compressor to replicate the tree constructed by the compressor. As will be seen, each LeafCopy and Node-Copy codeword contains two elements of information for specifying the symbol string which it represents: a node or leaf and an arc displacement (the displacement is required because the arcs of a PATRICIA tree may represent more than one symbol). It is to be understood that strings appearing two or more times within the span of the search window appear as a single node arc, so they are compressed as NodeCopies with no redundancy in their encoding.

More particularly, when a NodeCopy is called for, its identifying prefix is followed by a node number referencing the next free node within a range [0 . . . max-NodeNo], where maxNodeNo is the largest node number used since initialization of the compression system. Then, the arc displacement is encoded based on the number of symbols on the incoming arc. If, as is often the case, there is only a single symbol on the incoming arc, the displacement can be encoded inferentially by suppressing the length field. But, if the incoming arc represents a plurality of symbols, a length field is appended to the node number for recording a value indicating the location along the arc at which the match occurred. Typically, the recorded value is 0 for a match occurring exactly at the new node, 1 for a match occurring at a displacement of one symbol down from its parent node, 2 for a match occurring two symbols down from the parent node, etc. Suitably, a sparse code is employed for encoding the NodeCopy arc displacements, so the length fields of these codewords are usually composed of only one or two bits.

On the other hand, when a LeafCopy is called for, its identifying prefix is followed by a <1,1,11> unary coded length field (such a unary progression can encode arc lengths of up to 4094 symbols long) for specifying the distance down the leaf arc from the parent node at which the match terminated (with an arc displacement of zero denoting a literal). Following the length field of a LeafCopy having a non-zero arc displacement value (i.e., one that does not denote a literal), the search window symbol position of the lead symbol of the matching symbol string is coded; preferably by gradually phasing in another suitable unary progression, such as the <10−x,2,14−x> progression described above.

Literals suitably are uniquely identified by employing a LeafCopy having an arc displacement of 0 as their introductory bit sequence or "flag." Those introductory flag bits are followed by a length field into which the length of the literal is encoded using still another <start, step, stop> unary progression, such as a <0,1,5> code. The encoding rules prohibit a literal of less than maximum permissible length from being immediately followed by another literal, so the unary codes for the arc displacement of a LeafCopy encoded immediately after such a literal, may be shifted down by one, such that an arc displacement of 1 is then coded as 0, a displacement of 2 is coded as 1, etc.

Node numbers for NodeCopies are encoded using a sparse encoding for the values [0...maxNodeNo], even though it might be desired to manage them according to a least recently used (LRU) selection algorithm and to employ an encoding which reduces the number of bits required to identify the more recently used nodes. As will be appreciated, such a node management and encoding scheme could be implemented at the discretion of the designer.

As previously pointed out, to decompress the data, the expander for this embodiment must reconstruct and maintain a search tree which contains identical search paths to those of the compressor search tree during the compression/expansion of corresponding portions of the source data. Unlike the compressor, however, the codewords applied to the expander enable it to determine the length of each copy and to immediately locate the parent of any new nodes which are to be added to the tree. Thus, no hash tables are required for inserting symbol strings into the tree at the expander, provided that the encoding policy is restricted so that a copy is always selected if the longest match spans two or more symbols. With this restriction on the encoding policy, the expander can reconstruct the tree by hanging each new leaf from the node or arc indicated by the particular NodeCopy or LeafCopy codeword that it has decoded. Moreover, in the case of a decoded literal, the expander can hang the leaf from the permanent depth or level 1 node for the literal symbol (as will be recalled, a permanent depth 1 node is advantageously provided for each source symbol).

E. Representative Functional Flow Diagrams

To supplement the foregoing description, representative functional flow diagrams are described hereinbelow. While these diagrams are simplified and are specific to certain embodiments, they will provide a general framework for persons interested in carrying out this invention in its various forms. In an invertible or lossless compression system, the expander necessarily complements the compressor, so the functional performance characteristics of the compressor largely dictate the performance requirements of the expander. Some of the above-described compressors permit direct addressing of all symbols within the search window for locating prior occurrences of reoccurring symbol strings, while others locate such prior occurrences by indirect addressing of certain symbols within the search window (i.e., those which begin prior codewords or which have been previously emitted as literals) through the use of an array of pointers or by encoding the tree structure. The encoding and decoding of the tree structure for the compression and expansion of the source data is slightly more involved than the direct or indirect addressing of the search window contents, so tree structure encoding and decoding is featured in the following flow diagrams.

1. Locating and Extending a Matching Symbol String

Figure 12:
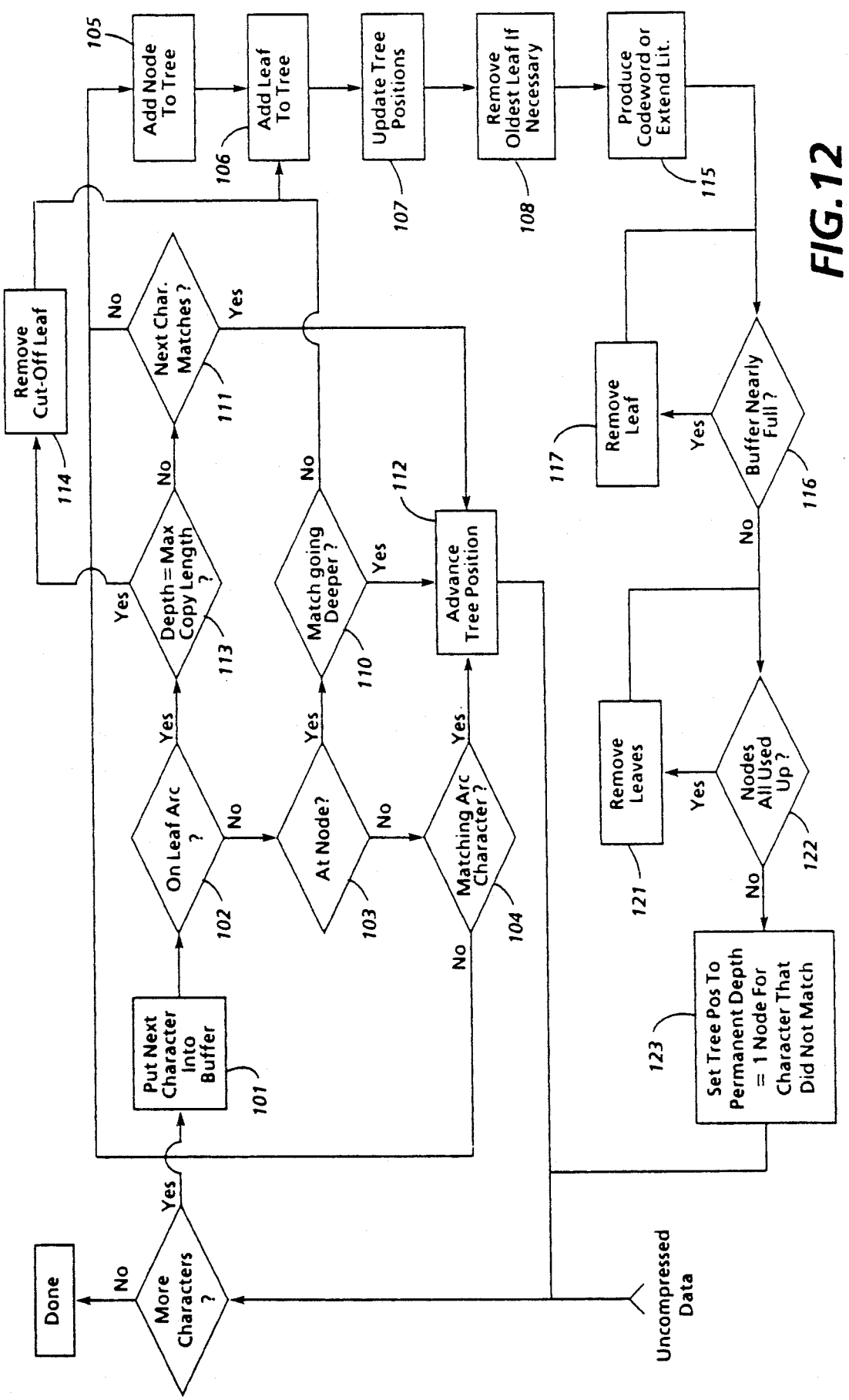
FIG. 12 is a simplified flow diagram for a textual substitution compressor using compressed displacements or having a tree structure encoder.

Referring to FIG. 12, all of the stream compressors utilize essentially the same process for maintaining their search trees 73 (FIG. 3) and for identifying prior occurrences of reoccurring symbol strings. As will be recalled file compressors "pull" source symbols from a file, rather than having the source symbols "pushed" at them, but otherwise they insert symbol strings into their search trees and maintain their search trees in generally the same way as their stream compressor counterparts. The "stream" implementations of the present invention are designed to satisfy a standard "stream" I/O interface specification, so that they may be layered easily with other stream procedures, such as data encryption and decryption routines and data communication protocols.

Appendix E, which is hereby incorporated by reference, sets forth procedures required to provide the stream compression and expansion functions consistently with the aforementioned I/O specifications (which are beyond the scope of the present invention). When a compression software package is loaded by the operating system, it registers itself with a compression method registry (not shown), so that the procedures provided by the method can be accessed by clients (i.e., data sources and sinks requiring the services of the compression system). To carry out compression, a client first initializes the data structures needed by the compressor by means of a "CreateEncodingStream" procedure; an argument to CreateEncodingStream is an output stream procedure to which codewords representing the source will be sent. Subsequently, the client submits blocks of characters for compression using a "CSUnsafePutBlock" procedure, or it submits single characters using a "CSPutChar" procedure. During the course of compressing a sequence of source symbols, the compressor accumulates codewords in its output buffer, but it will have other symbols represented in its internal data structures for which it has not yet produced codewords. Thus, if at any time the client wishes to force encoding of all symbols not yet represented by codewords, and to force all of these codewords to be sent to the output stream, then it calls a "CSFlush" procedure. CSUnsafePutBlock, CSPutChar, and CSFlush can be called repeatedly in any order. Finally, when the client has finished using the compressor and has issued a final CSFlush, it can release the storage that was in use by the compressor by calling a "CSClose" procedure.

Analogously, the expander has a "CreateDecodingStream" procedure for which an arugument is the input stream from which codewords are to be obtained. It also has an "ESUnsafeGetBlock" procedure which can be called to obtain blocks of uncompressed or decoded source symbols and an "ESGetChar" procedure which can be called to obtain single uncompressed source symbols. Furthermore, the expander has an "ESClose" procedure that releases the storage it has used.

When this stream compression system is used to compress a file, CSFlush is used only once, at the end of the file. CSFlush normally produces either a PadCopy or a PadLiteral codeword, as will be discussed below; these codewords are the principal difference between stream and file compressors. Because these codewords are assigned a very low probability, the encoding used by the stream compressor is almost identical to that which would be used by an equivalent file compressor, and the compression achieved is almost identical. It will be understood that the principal advantage of a stream compressor is that it can be used in other applications besides file compression, as was discussed previously.

Turning now to the compressor's CSUnsafePutBlock procedure, diagrammed in FIG. 12, the search tree initially consists of the permanent depth 1 nodes, an empty window, and an empty input character buffer; and the depth of the current match is 0. As characters are submitted for compression by CSUnsafePutBlock or CSPutChar, the tree grows and the window fills until one of its three resources is exhausted; these resources are defined by size parameters maxCopyDisp (the number of leaves or window positions in the tree), maxNodes (the maximum number of nodes allowed in the tree), and oBufSize (the maximum size of the input character buffer). The values for maxNodes and oBufSize are normally chosen so that most source data will exhaust the maxCopyDisp leaves before exhausting either the nodes or the character buffer. In that event, the compressor will eventually reach a "steady-state" operating condition in which, on each copy codeword or literal character, one leaf is freed and one leaf is allocated. For text and some other kinds of data, the degree of compression achieved on large sources will increase as maxCopyDisp increases. The exemplary implementation in Appendix E uses a window size of maxCopyDisp=16,384 positions, but it will be understood that this implementation is fully functional for values of maxCopyDisp between about 1,000 and 63,000.

At initialization of the compressor and after a CSFlush, the longest match depth is 0. However, following the execution of CSUnsafePutBlock or CSPutChar, the depth of the longest match is always greater than or equal to 1. When the next character is sent for compression, as at 101, the compressor first attempts to extend the current longest match to include this character, with the extended symbol string being inserted into the tree as indicated at 102, 103, 104, 111, 113, 110, and 112. The search path followed during the insertion of the extended symbol string is determined by the position of the current match in the tree. Specifically, (1) if the current match is on a leaf arc, the search path for the extended string is defined as at 102, 111, 113, and 112, (2) if the current match is exactly at a node, then the search path is determined as at 102, 103, 110, and 112, or (3) if the current match is on an internal arc of the tree, then the search path is identified as at 102, 103, 104, and 112.

When a match cannot be extended further on an internal arc of the search tree, as at 104, or on a leaf arc of the tree, as at 111, a node is taken from the free list and spliced into the tree at the point at which the match terminated, as at 105. The new leaf is then hung from this new node, as at 106. Or, if a match cannot be extended beyond an existing node, as at 110, then the new leaf is hung from the existing node, as at 106. A match also is terminated whenever it reaches the maximum permissible copy length or depth on a leaf arc, as at 113. Under those circumstances, however, there is no useful difference between the new string and the prior occurrence that resulted in the match, except for a temporal distinction and the resulting difference in their positions relative to the search window. Thus, the old cut-off leaf for the string is removed, as at 114, and the new leaf put in its place, as at 106. In those cases where a node is obtained from the free list, a check is made for the free list being empty, indicating that all nodes are in use. When this occurs, a new node is created and put on the free list, provided that the maximum node allocation determined by the "maxNodes" parameter has not been reached.

Finally, tree positions are updated, as at 107, beginning with the parent node for the new leaf and going upward in the tree until the permanent depth 1 node is reached. In this embodiment, all nodes are updated to the root, but it will be understood that a percolating update, such as described hereinabove, could be employed. Also, some embodiments could update node positions during descent into the tree.

At this point, the tree has been updated and correctly represents the new symbol string. The next steps are associated with encoding the string just represented in the tree and preparing to determine the next match. If the window is full, the oldest leaf is removed from the tree, as at 108, so that its storage can be reused for the leaf that will be created next time (this step is unnecessary if the compressor has not yet filled its window, or if that leaf has already been removed due to reaching cut-off depth as at 114, or if it has already been removed to make space in the buffer as at 117, or if it has already been removed because the number of nodes allocated for the tree was exhausted as at 121). Next, encoding is carried out, as in 115; this is more fully explained below and in FIG. 13.

After encoding, the compressor checks its output buffer, as at 116, to determine whether the buffer has sufficient free space to store a copy of length maximum permissible copy length (a worst case for the next codeword) if not, the oldest leaves are removed from the tree, as at 117, for freeing sufficient storage space in the buffer for such a copy plus an additional amount of storage, "oBufReserve" (see Appendix E). Inasmuch as each leaf represents one or more symbols in the buffer, freeing a leaf also frees buffer space. After checking the output buffer, the compressor checks, as at 122, to determine whether the node free list is empty (which implies that maxNodes nodes are presently being used in the tree). If so, it removes the oldest leaves from the tree by a batch removal process, "ToFree leaves" (which has a parameter value of 100). Deleting a leaf often causes a parent node having only one remaining son, so the above-described node deletion or reclamation process can then be employed to reclaim that parent node and put it on the free list, but it is to be noted this step is repeated until the node free list contains one or more free nodes. As will be appreciated, a somewhat simpler variation of the compresor might eliminate steps 121 and 122 of FIG. 12 by allocating a number of nodes greater than or equal to the worst case requirement for maxCopyDisp leaves. Indeed, this alternative is discussed as a comment in Appendix E and is employed in the implementations of Appendices C and D. However, the disadvantage of this alternative approach is that it the storage requirements of the compressor.

Finally, the character just submitted to the compressor, which did not extend the longest match, becomes the first character of a new match, as at 123. The tree position is set to be the permanent depth 1 node for this character, and the compressor then loops to accept another character.

It will be understood that FIG. 12 depicts either the compressor in Appendix E or the one in Appendix D;

these two compressors differ in the encoding details concealed in the encoding function 115 which is explained hereinbelow. In addition, the compressor in Appendix D uses the simpler variation discussed hereinabove in which the node management steps 121 and 122 are eliminated by providing a number of nodes sufficient for the worst case requirement of "maxCopyDisp" leaves.

2. A Tree Structure Encoder

Figure 13:
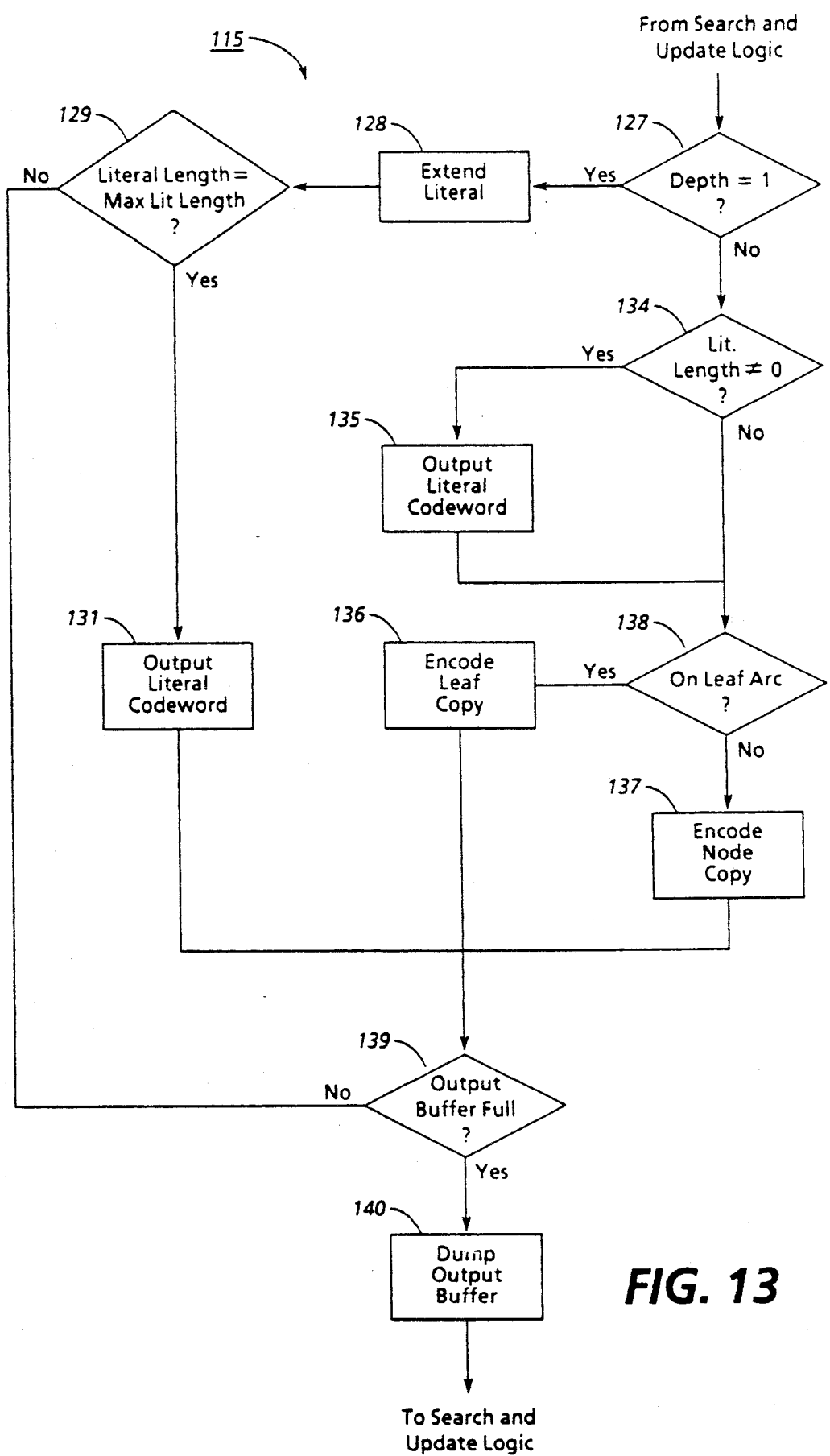
FIG. 13 is a simplified flow diagram of a tree structure encoder of the compressor shown in FIG. 12.

Step 105 in FIG. 12 represents the encoding section of the compressor; the tree-structured encoder of Appendix E is more fully diagrammed in FIG. 13. The job of the encoding section is to represent the source compactly by means of NodeCopy, LeafCopy, Literal, PadLiteral, and PadCopy codewords. The kind of codes used are advantageously prefix codes, which means that no codeword is a prefix of any other, so that the expander can unambiguously decode the stream of codewords.

For the embodiment in Appendix C, the encoding section is entered once per character, regardless of whether or not that character has already been represented by a copy codeword, so a character skip count is employed as in FIG. 3 step 78. This is used to count down through the characters already represented by a copy codeword until it is time to produce another codeword. However, the embodiments in Appendices D and E do not require this skip count because the encoder for them is never entered again for characters already encoded.

The encoder first decides when the next character is going to be represented in a literal and when it is going to be represented in a copy. If the longest match is of length 1, then the character must be represented in a literal, but if the longest match is of length 2 or longer, then the policy can choose to represent it either in a literal or in a copy. The embodiments in Appendices C and D do not base this policy decision purely upon the length of the longest match; the reason for this is that the encoding of a Literal of length 1 requires 4 bits (plus the character), while a Literal of length 2 or 3 requires 6 bits (plus the characters); in other words, the "cost" of initiating a literal is 4 bits, while the extension from length 1 to length 2 costs only 2 bits, and the extension from length 2 to 3 costs 0 bits. Because these costs differ, the encoder advantageously is reluctant to initiate a literal, but once it has begun one, it is reluctant to terminate it in favor of a copy; in other words, there advantageously is "hystersis" in the policy decision. These considerations led to the simple policy described hereinabove in which a copy of length 2 is preferred to a literal, but once the literal has been started, only a copy of length 3 (or reaching maximum literal length) can stop it. One can imagine other policies that achieve slightly higher compression at the cost of slightly greater complexity.

In the case of the tree structure encoder of Appendix E, however, another consideration comes into play; namely, it is desirable for the expander to be able to recreate the tree from the codewords it is decoding without resorting to hash tables or other data structures like those of the compressor. To this end, it is advantageous to restrict the policy to always choose a copy when the longest match is of length 2 or longer, and to initiate or extend a literal only when the longest match is shorter; as a result of this restriction, the expander will always be able to hang the leaf for a literal character from the permanent depth 1 node corresponding to that literal character. As a result of this policy restriction, the expander is simpler, runs faster, and requires less storage, though it typically achieves slightly lower compression than would be the case if a more complex policy were followed.

Turning to FIG. 13, it will be evident that the encoding is dependent on the compression algorithm that is employed. However, in keeping with a common characteristic of all of the preferred compression algorithms, it is first determined, as at 127, whether a literal is being encoded or not. For the encoding of a literal, the length of the literal is extended, as at 128, during each iteration of the above-described insertion process, until there is a copy to be encoded or until a literal of maximum permissible literal length is assembled, as at 129. Whenever a literal reaches its maximum permissible length, a literal codeword, as at 131, is loaded into the output buffer immediately ahead of the literal symbols that have been accumulated. Likewise, when there is a copy to be encoded, the accumulated literal length count is checked, as at 134, to determine whether a literal is being accumulated. If so, a literal codeword, as at 135, and the accumulated literal symbols are loaded into the output buffer before the copy codeword (as will be recalled, the literal codeword and its appended literal source symbols may be loaded into the compressor output buffer anytime after the existence of the copy has been confirmed and before the codeword for the copy is loaded). Whenever, a literal is output, the accumulated literal symbol count at 134 is reset to zero so that another literal can be accumulated.

In this instance, copies are encoded using a LeafCopy 136 or a NodeCopy 137 depending on whether the copy terminates on a leaf arc or not, as determined at 138. The output buffer is checked, as at 139, after each literal and copy is loaded into it and is dumped, as at 140, when it is essentially full. The various details of the tree-structured encoding are described by comments in Appendix E; an additional description of the encoding appears in the discussion of the expander hereinbelow.

3. Byte Aligning the Encoder

Figure 14:
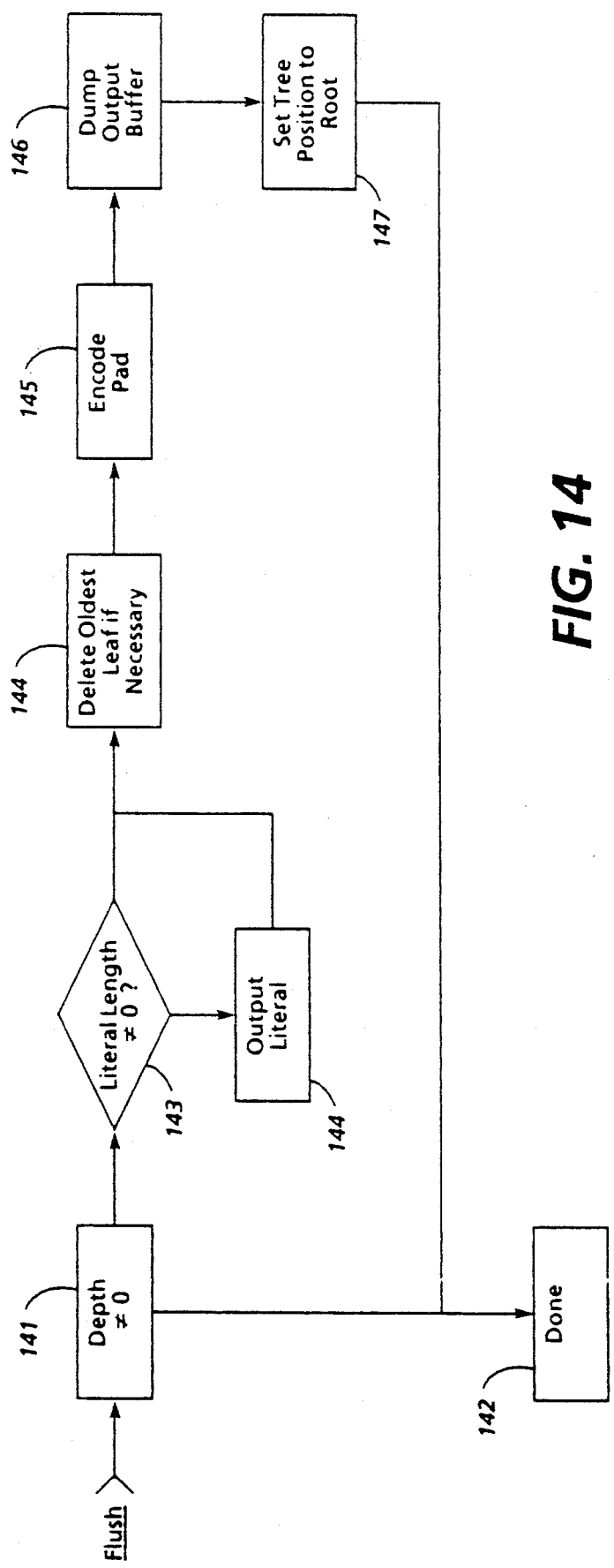
FIG. 14 is a simplified flow diagram of a flush and pad subroutine for word aligning the compressed output of the compressor shown in FIG. 12.

Referring to FIG. 14, a flush process is employed for outputting codewords for any partial literals and or copies remaining in the compressor when a flush command is issued. In a file compressor, such a command is issued only at the end of the file, at which time it usually is necessary to flush the last few symbols of the file out of the compressor, even though the compressor may not be prepared to output an ordinary copy or literal codeword, and where it may be necessary to terminate the preceeding string of bits so that they are no misinterpreted as being a codeword. For a stream compressor, the flush process might also be to used provide some additional compressed data for a receiver while the source data for the compressor is temporarily exhausted. In either type of compressor, flush restores the byte or word alignment of the compressed data (the Appendix E embodiment restores the alignment to a 16-bit boundary.

When a flush is initiated, normal operation of the compressor is temporally suspended, and the depth at which its search tree 73 (FIG. 3) is prepared to insert the next symbol or character is checked, as at 141. If the tree is already set to its root, the flush is aborted, as at 142, and the compressor is promptly restored to normal operation. Otherwise, the accumulated literal count is checked, as at 143, and a literal codeword is output, as at 144, to accompany the accumulated symbols of any literal interrupted by the flush. After outputting any accumulated literal, the oldest leaf is removed from the tree, as at 144, if it has not already been deleted. However, the tree is not updated for th symbols encoded by the Pad codeword because they do not define an unambiguous search path. Next, the flush is encoded, as at 145, using a PadLiteral codeword to accompany the one source symbol that is still in the compressor search tree if the tree is at a depth 1 node when the flush is initiated, or a PadCopy codeword to identify the search window symbol position and length of the interrupted copy if there are two or more source symbols still in the tree. The PadLiteral or PadCopy codeword is loaded into the compressor output buffer, and additional bits are added to it to align the output of the buffer at a convenient boundary, such as the next 16-bit boundary as in this particular example. Finally, the buffer is dumped, as at 146, and the search tree 73 (FIG. 3) is then reset to its root, as at 147 to prepare the compressor to receive more characters.

4. A Tree Structure Expander

In accordance with the Appendix E embodiment of the invention, a client initializes the expander by calling a "CreateDecodingStream" procedure, which has as an argument an input stream (or data source) from which codewords will be obtained. After initialization, the client makes repeated procedure calls to "ESUnsafeGetBlock", which reads a block of characters, and to "ESGetChar", which reads single characters, to extract uncompressed or expanded symbols by successively decoding codewords from the input stream as directed by the client. "ESEndOf" can be used to check for the inability of the expansion stream to deliver more symbols. Because the implementation of "ESGetChar" simply calls "ESUnsafeGetBlock" with a symbol count of 1, the description here will be confined to the "ESUnsafeGetBlock" procedure, although it will be understood that a similar description would apply to the "ESGetChar" procedure.

Figure 15A:
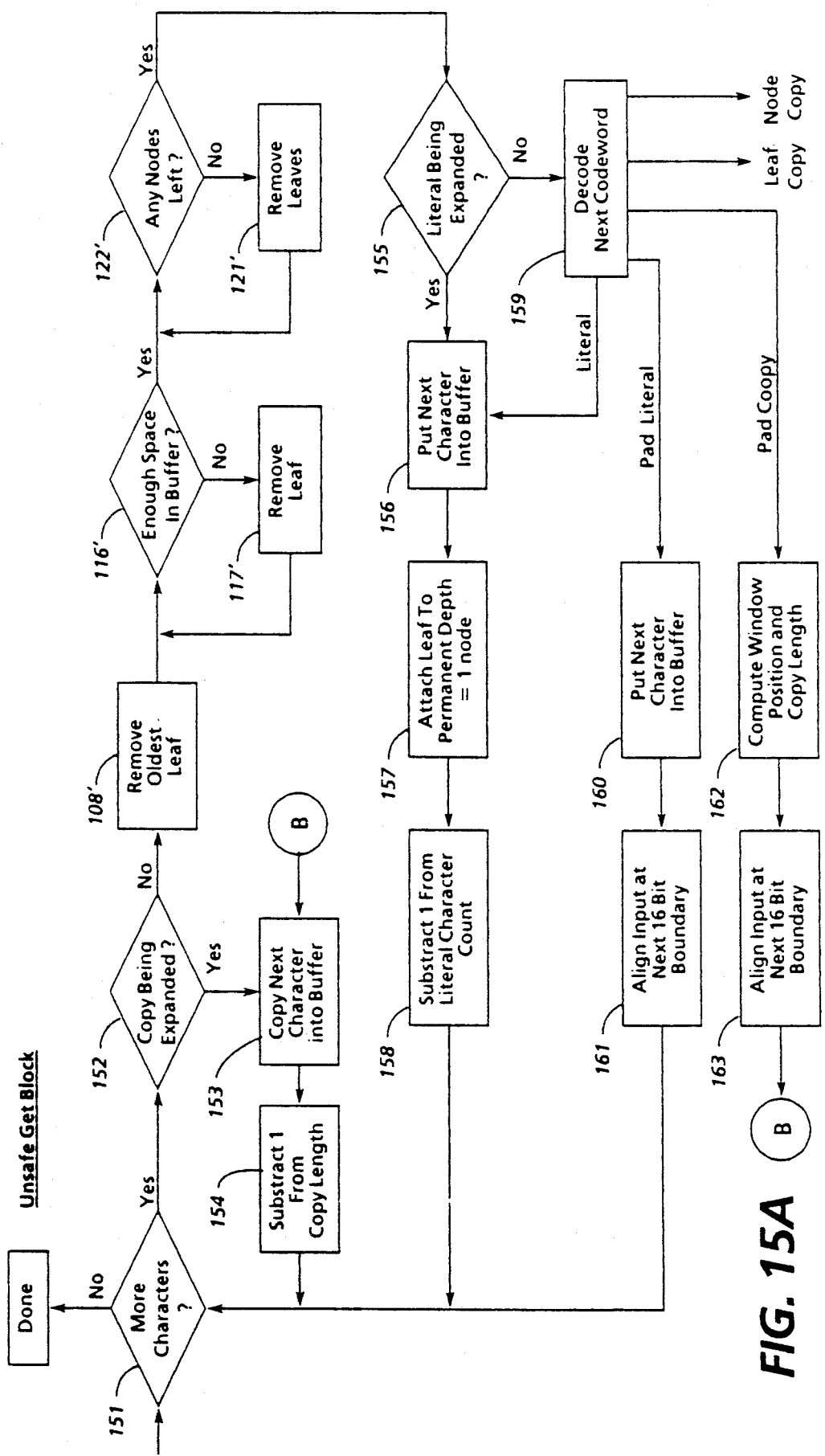
FIGS. 15A–15B combine to form a simplified flow diagram of an expander for the compressor shown in FIGS. 12–14.
Figure 15B:
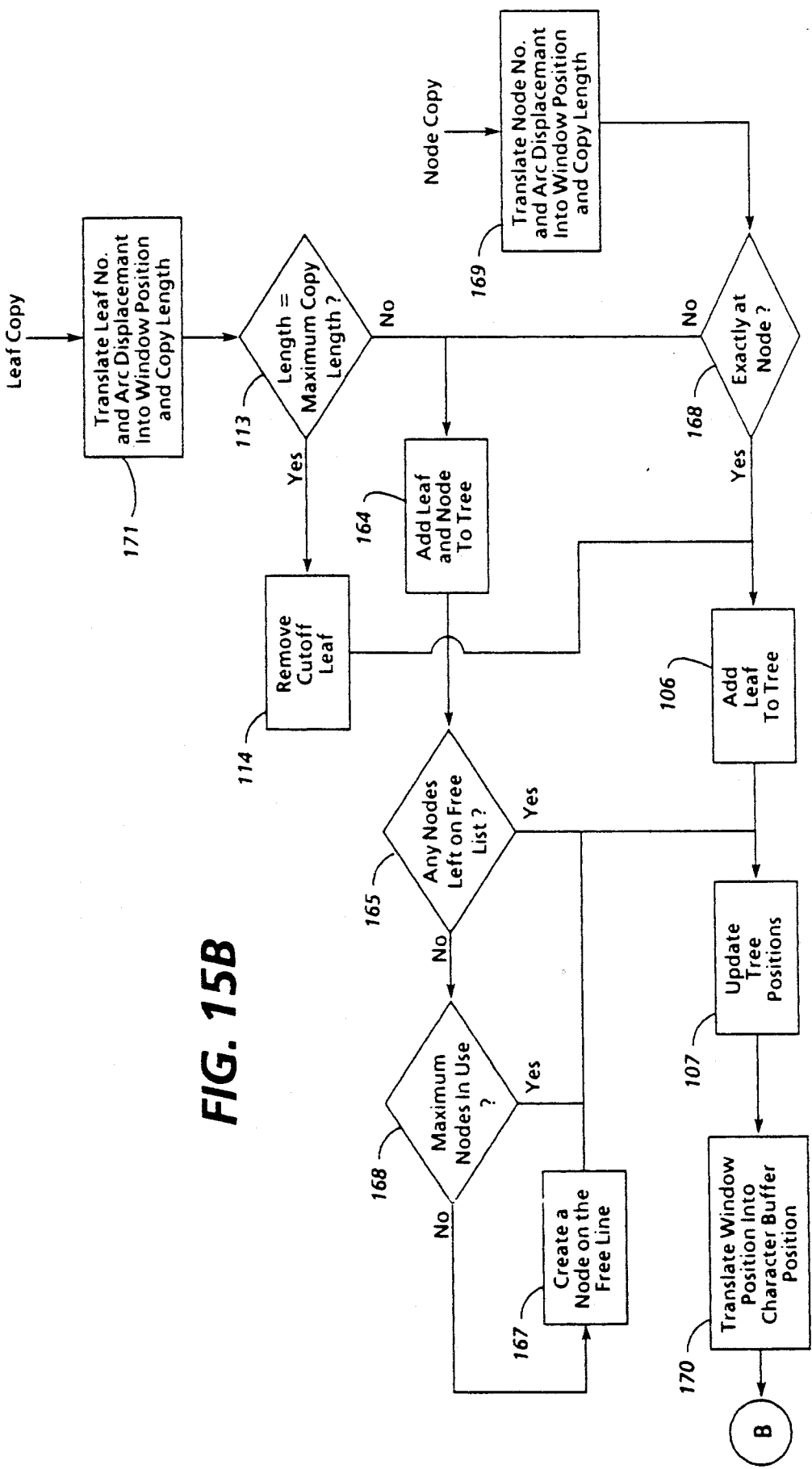

Turning to FIGS. 15A and 15B, it will be seen that the expander complements the compressor to faithfully recover the original source data. To that end, as was pointed out hereinabove, the expander's data structures are initialized exactly like the compressor's. Furthermore, whenever a codeword is decoded, the expander tree and search window are identical to the compressor tree at corresponding steps of the compression process. As will be understood, the steps taken by the expander to decode codewords are dictated completely by the encoding.

The expander of Appendix E has an Input subroutine for obtaining bits from its input stream. Whenever more bits are needed for another codeword or literal character, as at 156, 159, and 160, then this subroutine is called to obtain the bits. When the input stream is completely exhausted, an "EndOfStream" error flag is raised, thereby causing the "ESUnsafeGetBlock" procedure to return to its client with a character count smaller than that requested. That causes the client to terminate the expansion.

The expander has state variables which are the buffer position and residual length of the current copy being expanded, if any; or the residual length of the current literal being expanded, if any. When another character is requested, as at 151, "ESUnsafeGetBlock" first checks these variables to see if it can deliver the next symbol without decoding another codeword. If a NodeCopy, LeafCopy having a non-zero arc displacement), or PadCopy codeword is in the process of being expanded, the expander uses the steps indicated at 152, 153, and 154 to deliver the next character by copying it from another place in the character buffer. On the other hand, if a Literal codeword (i.e., a LeafCopy with a zero arc displacement) is in the process of being expanded, the expander uses the steps indicated at 152, 155, 156, 157, and 158 to expand the next literal character.

As will be seen, that the tree is updated on every literal character and on every copy codeword. Steps 108', 116', 117', 122', and 121' are associated with providing for leaves, nodes, and buffer space in exactly the same way as is described hereinabove in connection with the compressor. Likewise, steps 108', 116', 117', 122', and 121' cause a leaf to be attached, as at 157, to its permanent depth 1 node of the expander tree, exactly as was done by the compressor. Therefore, primed refernce numerals corresponding to those that were employed for describing the compressor have been employed to identify the like steps of the expansion process, When the current copy or literal is exhausted, it is appropriate to decode the next codeword, as at 159. This will result in a new leaf being added to the tree, if the codeword is a NodeCopy or LeafCopy. Additionally, a leaf will also be added to the expander tree for the first character of each Literal. To prepare for these possible codewords, steps 108', 116', 117', 122', and 121' are again used to ensure that the resources required for the leaf are available and to ensure that the expander tree has the same configuration during decoding that the compressor tree had during encoding.

The decoder, as at 159, can easily distinguish one codeword from another because the encoding employs a family of codes known as "prefix codes," which means no codeword is a prefix of any other. Thus, there is only one possible interpretation of any sequence of bits. Specifically, in the encoding used by Appendix E, the first bit of the codewords distinguishes NodeCopy codewords from LeafCopy, Literal, PadCopy, and PadLiteral codewords. If this bit signals a NodeCopy, then the maximum node number in use determines the number of bits that will be read and decoded as a node number using the "sparse coding" technique discussed hereinabove. The node number, in turn, is used to reference the tree and to determine the length of the incoming arc to that particular node. Moreover, if the incoming arc to the specified node is longer than one symbol long, its symbol length determines the number of bits decoded as an arc displacement, again based on "sparse code" representation of the arc length. It is to be noted that the decoding of the node number requires the expander to use the same value for the maximum node number as the compressor and to have a tree in which the nodes are numbered and used in exactly the same way as the compressor.

Whenever the first bit processed by the decoder, as at 159, indicates that the codeword being decoded is not a NodeCopy, a <1,1,12> unary code is decoded, except that the largest or stop-size field of the code (i.e., a unary codeword comprising "indicator" of 11 binary 1's (i.e., 11111111111), is reserved for "escaping" from the unary code to output a PadCopy or a PadLiteral codeword. If the decoded value of the <1,1,12> unary code is 0, indicating a Literal, the decodes next decodes a <0,1,5> unary code as the literal length to determine the number of literal source symbols that are appended to the Literal.

If the decoded value of the <1,1,12> unary code is in the range [1..4094], it is interpreted as an arc displacement down a leaf arc from the node parent of that leaf arc. Thus, the compressed displacement is decoded based in this instance on a <10−x,2,14−x> unary code and on the "sparse coding" of its largest or "stop" field, as discussed hereinabove for the encoder.

In the event that the arc displacement signifies a Pad-Copy or PadLiteral, the PadCopy length field is decoded using a <1,1,12> unary code. If the decoded value of this field is zero, it means the codeword is a PadLiteral, which will be followed by a single literal character. Otherwise, after the PadCopy length is decoded, the relative displacement to the search window position of the first or lead symbol of the longest match is decoded using a <10−x,2,14−x> unary code with the sparse field improvement for the largest or "stop" field. All of these details conform to the encoding operations performed by the compressor described hereinabove.

When the decoder decodes, as at 159, a LeafCopy or PadCopy, it produces a compressed displacement which is the number of compressed positions (i.e., the number of copy codewords or literal characters) between the current window position and the one at which the longest match was found. The compressed displacement is translated into a compressed window position, or, equivalently, a leaf number, by subtracting the compressed displacement from the current window position modulo the window size. When the decoder decodes a NodeCopy, the compressed window position for the specified node is obtained from the node in the tree. In all of these cases, the compressed window position is translated into a character buffer position by reading the "cWindow" array entry for the compressed window position (see Appendix E); these translations are shown diagrammatically in FIG. 15B at 162 and 170.

No leaf is added to the expander tree in response to the decoding of a PadLiteral or a PadCopy codeword. The reasons a leaf is not added to the tree are specific to this particular embodiment of the compression system and are explained in a long comment preceding the "CSFlush procedure" in Appendix E. They are not, however, sufficiently relevant to the thrust of the invention to warrant further discussion. Indeed, persons skilled in the programming art will recognize that there are a variety of ways for implementing the Pad function. Nevertheless, the function is important, so it is noted that the expander places the single symbol from a PadLiteral codeword into the character buffer, as at box 160, and then aligns the input stream at a 16-bit word boundary, as at 161, by skipping bits from the input stream up to the next 16-bit aligned position. Likewise, in response to a PadCopy, the expander translates the PadCopy compressed displacement into a character buffer position (as discussed hereinabove) and saves the PadCopy length, as at 162. It then aligns at a 16-bit boundary, just as for a PadLiteral, before completing the process by copying the symbols represented by the PadCopy into the buffer, as at 153 and 154.

When the decoder has decoded, as at 159, a Leaf-Copy, it next translates the compressed displacement into a leaf number or window position as discussed hereinabove. Then it follows the parent pointer from the indicated leaf in the tree to the node parent of that leaf (as will be understood, the depth of this node plus the arc displacement is the number of characters that will be copied). if it is determined, as at 113, that computed copy length is equal to the maximum permissible copy length, the cut-off leaf for the reoccurring symbol string is removed from the tree, as at 114' to be replaced by the new leaf, as at 106'. Again it will be seen these actions exactly correspond to equivalent actions within the compressor. If, as is normally the case, the maximum permissible copy length was not reached, then a leaf and node are added to the tree, as at 164. Steps 165, 166, and 167 are associated with gradually increasing the number of nodes in use until the maximum permissible number of nodes, "maxNodes", are in service (they provide a somewhat more detailed account of the function of step 105 in the compressor). After these node free list checks, which ensure that the node free list is not empty unless maxNodes nodes are in use, tree positions are updated, as at 107' exactly like in the compressor at 107, and the window position is translated into a character buffer position, as at 170, by reading the "cWindow" array, as discussed hereinabove. Finally, the first character of the LeafCopy is copied, as at 153 and 154.

When the decoder has decoded a NodeCopy, the depth and window position of the indicated node are obtained from the tree, as at 169. If the arc displacement is zero, as tested in 168, then the longest match terminated exactly at a node; in this case, the new leaf is hung from the indicated node, as at 106'. Otherwise, a new node is obtained from the free list and inserted into the tree at the indicated arc displacement from the parent of the indicated node, and the new leaf is hung from the new node, as at 164. The other actions are the same as for a LeafCopy, as indicated at 165, 166, 167, 107', 170, 153, and 154.

After a character has been delivered, the expander cycles back to step 151 and continues.

Conclusion

In view of the foregoing, it will be understood that non-redundant encoding for textual substitution data compression systems is provided by encoding the structure of search tree constructed and maintained by the compressor of the compression of the source data, thereby enabling an encoder to reconstruct an identical search tree for expanding the data.

What is claimed:

1. In a textual substitution data compression system having a compressor and an expander, the improvement in said compressor comprising buffer memory means for serially receiving source symbols and for providing first in/first out storage for a finite number of said source symbols, a portion of said buffer memory means defining a finite length search window;

logic means coupled to said buffer memory means for constructing and maintaining a search tree organized data structure which links the source symbols within said search window in accordance with their order of occurrence to produce symbol strings and for tracking displacements of said symbol strings within said search window in accordance with a most recent occurrence criterion; said logic means having a test mode for testing source symbols just prior to their entry into said search window against said data structure to determine whether said search window contains any matching symbols and an extend mode for evaluating the displacement and length of the longest symbol string within said search window which matches any matched symbol and the symbols following it;

encoding means coupled to said logic means for encoding matched symbol strings composed of at least a minimum plural number of source symbols as copy codewords specifying the displacement and the length of the matching symbol string and for encoding all other symbols as literal codewords specifying the symbols, thereby enabling said expander to maintain an updated replica of said search tree organized data structure; said minimum number of source symbols varying as a function of a predefined state of said encoding means.

2. The improvement of claim 1 wherein
said data structure contains only one symbol for each branch of said search tree.

3. The improvement of claim 2 wherein
said search tree has internal nodes that represent respective symbol strings, said data structure branches from said internal nodes, and substantially all of said nodes have pointers to nodes for the suffixes of the symbol strings they represent, whereby new symbols can be added to said data structure to extend all existing symbol strings by following said pointers from the nodes from said existing symbol strings to the nodes for their suffixes.

* * * * *